(12) United States Patent
Jung et al.

(10) Patent No.: US 11,430,773 B2
(45) Date of Patent: Aug. 30, 2022

(54) STRETCHABLE DISPLAY DEVICE

(71) Applicant: LG Display Co., Ltd., Seoul (KR)

(72) Inventors: Hyunju Jung, Seoul (KR); Eunah Kim, Seosan-si (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 17/031,567

(22) Filed: Sep. 24, 2020

(65) Prior Publication Data

US 2021/0134772 A1 May 6, 2021

(30) Foreign Application Priority Data

Nov. 4, 2019 (KR) .................. 10-2019-0139302

(51) Int. Cl.
*H01L 27/15* (2006.01)
*H01L 25/16* (2006.01)
*H01L 23/00* (2006.01)

(52) U.S. Cl.
CPC ............ *H01L 25/162* (2013.01); *H01L 24/32* (2013.01); *H01L 25/167* (2013.01); *H01L 2224/26145* (2013.01); *H01L 2224/32145* (2013.01); *H01L 2924/12041* (2013.01); *H01L 2924/1426* (2013.01)

(58) Field of Classification Search
CPC ..... H01L 25/167; H01L 27/156; G09F 9/301; G09F 9/302; G09F 9/3023
See application file for complete search history.

(56) References Cited

U.S. PATENT DOCUMENTS

| 10,651,265 | B2* | 5/2020 | Park | H01L 27/3246 |
| 2009/0219225 | A1* | 9/2009 | Cope | H01L 25/0655 345/55 |
| 2017/0294610 | A1* | 10/2017 | Sasaki | H01L 27/3211 |
| 2020/0006684 | A1* | 1/2020 | Liu | H01L 27/3276 |
| 2020/0259108 | A1* | 8/2020 | Wang | H01L 27/3218 |
| 2021/0043713 | A1* | 2/2021 | Sun | H01L 27/3218 |
| 2021/0376266 | A1* | 12/2021 | Li | H01L 51/5253 |
| 2022/0037425 | A1* | 2/2022 | Ju | H01L 51/56 |

FOREIGN PATENT DOCUMENTS

KR 2019-0023758 A 3/2019

* cited by examiner

*Primary Examiner* — Michele Fan
(74) *Attorney, Agent, or Firm* — Seed IP Law Group LLP

(57) ABSTRACT

In one or more embodiments of the present disclosure, a stretchable display device includes a base substrate having thereon a display area and a non-display area, a plurality of first substrates which is disposed on the display area and has a modulus larger than a modulus of the base substrate, at least one transistor formed on each of the plurality of first substrates, a planarization layer which covers the at least one transistor; at least one light emitting diode which is electrically connected to the at least one transistor and is formed on the planarization layer, and a plurality of adhesive patterns which is attached to each of the at least one light emitting diode, in which the planarization layer includes at least one first sink pattern formed at a side portion of the at least one light emitting diode. The stretchable display device according to the embodiments thereby suppresses the degradation of an extension rate of the stretchable display device.

23 Claims, 14 Drawing Sheets

STRETCHABLE DISPLAY DEVICE

CROSS-REFERENCE TO RELATED APPLICATIONS

This application claims the priority of Korean Patent Application No. 10-2019-0139302, filed Nov. 4, 2019, in the Korean Intellectual Property Office, the disclosure of which is incorporated herein by reference.

BACKGROUND

Technical Field

The present disclosure relates to a stretchable display device, and more particularly to a stretchable display device with a pixel structure which suppresses the degradation of an extension rate.

Description of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a stretchable display device which is manufactured by forming a display unit and a wiring line on a flexible substrate such as plastic which is a flexible material so as to be stretchable in a specific direction and changed in various forms is getting attention as a next generation display device.

BRIEF SUMMARY

One or more embodiments of the present disclosure provides a stretchable display device which can reduce the degradation of an extension rate.

Further embodiments of the present disclosure provides a stretchable display device which reduces a driving failure of a light emitting diode.

Technical benefits of the present disclosure are not limited to the above-mentioned benefits, and other benefits, which are not mentioned above, can be clearly understood by those skilled in the art from the following descriptions.

According to an aspect of the present disclosure, a stretchable display device includes a lower substrate including a display area and a non-display area; a plurality of first substrates which is disposed on the display area and has a modulus larger than a modulus of the lower substrate; at least one transistor formed on each of the plurality of first substrates; a planarization layer which covers the at least one transistor; at least one light emitting diode which is electrically connected to the at least one transistor and is formed on the planarization layer; and a plurality of adhesive patterns which is attached to each of the at least one light emitting diode, in which the planarization layer includes at least one first sink pattern formed at a side portion of the at least one light emitting diode, thereby suppressing the degradation of the extension rate.

According to another aspect of the present disclosure, a stretchable display device includes a soft substrate which is stretchable; a plurality of rigid substrates which is disposed on the soft substrate to be spaced apart from each other; a plurality of sub pixels which is defined on the plurality of rigid substrates and includes a light emitting diode attached by an adhesive layer; a plurality of first sink pattern which is formed at a side portion of the plurality of sub pixels; at least one second sink pattern which connects the plurality of first sink patterns; and a third sink pattern which encloses the plurality of sub pixels.

Other detailed matters of the embodiments are included in the detailed description and the drawings.

According to the present disclosure, when a light emitting diode is formed, an adhesive material which degrades an extension rate is suppressed so as not to overflow onto the soft substrate to suppress the degradation of the extension rate of the stretchable display device.

According to the present disclosure, the adhesive material does not permeate a side surface of a light emitting diode to suppress the failure of the light emitting diode.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
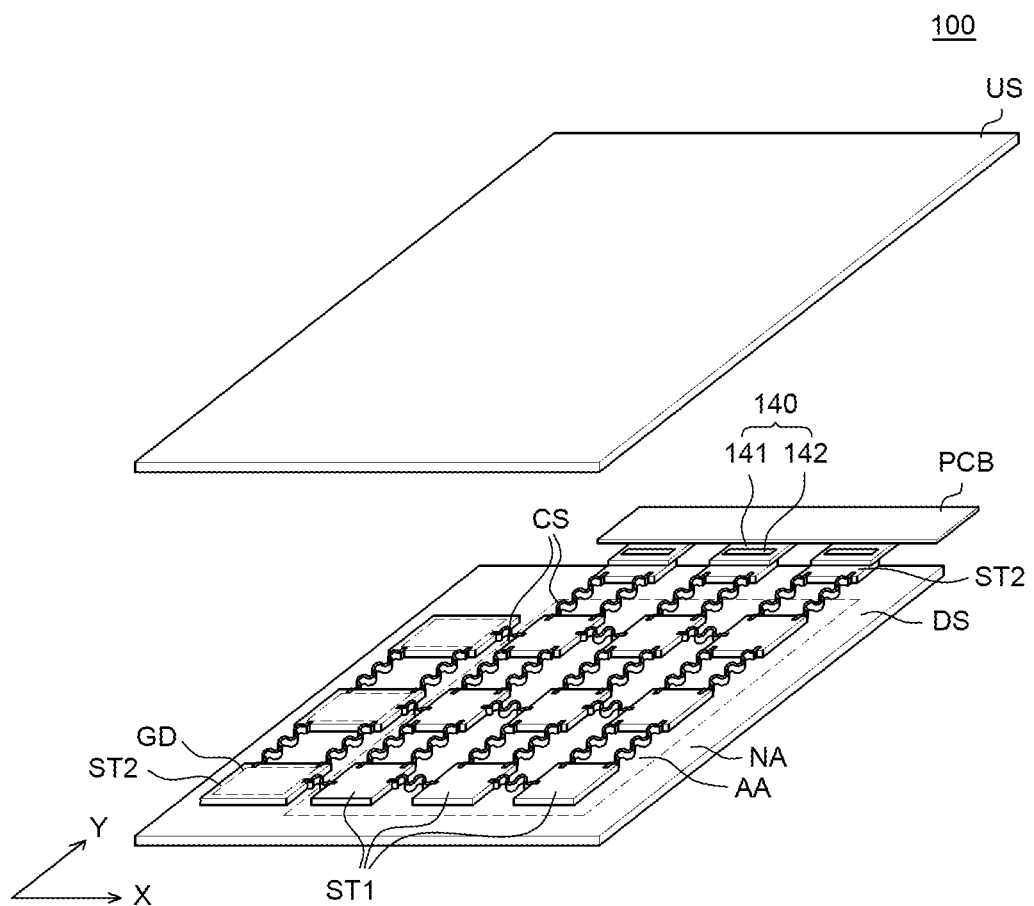
FIG. 1 is an exploded perspective view of a stretchable display device according to an embodiment of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to embodiments of the present disclosure will be described in detail with reference to accompanying drawings.
Stretchable Display Device A stretchable display device may be referred to as a display device which can display images even though the display device is bent or extended. The stretchable display device may have a high flexibility as compared with a general display device of the related art. Therefore, a shape of a stretchable display device may be freely changed in accordance with manipulation of a user to bend or extend a stretchable display device. For example, when the user holds ends of the stretchable display device to pull the stretchable display device, the stretchable display device may be extended by the force of the user. Alternatively, when the user disposes the stretchable display device on a wall surface which is not flat, the stretchable display device may be disposed to be bent in accordance with the shape of the surface of the wall surface. Further, when a force applied by the user is removed, the stretchable display device may return to its original shape.

FIG. 1 is an exploded perspective view of a stretchable display device according to an embodiment of the present disclosure.

Referring to FIG. 1, a stretchable display device 100 includes a lower substrate DS, a plurality of first substrates ST1, a plurality of second substrates ST2, a plurality of connection substrates CS, a chip on film (COF) 140, a printed circuit board PCB, and an upper substrate US.

The lower substrate DS is a substrate which supports and protects several components of the stretchable display device 100. The lower substrate DS which is a soft substrate, or a flexible substrate may be configured by an insulating material which is bendable, pliable, extendable or stretchable. For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

The lower substrate DS is a soft substrate so as to be reversibly expanded and contracted. Further, an elastic modulus of the lower substrate DS may be several MPa to several hundreds of MPa, for example, may be 0.7 MPa to 1 MPa. Further, a ductile breaking rate of the lower substrate DS may be 100% or higher. Here, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., lower substrate DS) is 100 cm when the object is not stretched and then, it reaches a length of 110 cm when the object has been stretched enough that it becomes broken or cracked at this length, then it was been stretched to 110% of its original length. In this case, the ductile breaking rate of the object is 110%. The number could thus also be called a ductile breaking ratio since it is a ratio of the stretched length as the numerator compared to the original upstretched length as the denominator at the time the break occurs.

The object is considered broken when it can no longer function properly in the structure or circuit. For example, a wire that is a conductor would be considered broken when there is a sufficient degradation in its ability to carry current that it does not operate within the specifications of the circuit. Thus, in some embodiments, it might not require a full disconnection of the wire for it to be considered broken, a minor stress at a connection ends, a minor crack, a slight shift of the wire's location or other movement that causes it to no longer operate within its expected function would be considered a broken wire. If an insulator is stretched sufficiently that it no longer provides the amount of insulation needed for the structure or circuit, it would be considered broken. Breaking will also include in some embodiments a non-elastic stretching in which the object has been sufficiently stretched that it does not return to its original length and/or shape when it is no longer stretched. The lower substrate DS may have a display area AA and a non-display area NA adjacent to the display area AA.

The display area AA is an area in which an image is displayed in the stretchable display device 100 and a display element and various driving elements for driving the display element are disposed in the display area AA. The display area AA includes a plurality of pixels including a plurality of sub pixels. The plurality of pixels is disposed in the display area AA and includes a plurality of display elements. The plurality of sub pixels may be connected to various wiring lines, respectively. For example, the plurality of sub pixels may be connected to various wiring lines such as a gate line, a data line, an emission signal line, a high potential power line, a low potential power line, a reference voltage line, or a compensation signal line.

The non-display area NA is an area adjacent to the display area AA. The non-display area NA is adjacent to the display area AA to enclose the display area AA. In the non-display area NA, no image is displayed and wiring lines and circuit units may be formed. For example, in the non-display area NA, a plurality of pads may be disposed, and the pads may be connected to the plurality of sub pixels of the display areas AA, respectively.

The plurality of first substrates ST1 and the plurality of second substrates ST2 are disposed on the lower substrate DS. The plurality of first substrates ST1 may be disposed in the display area AA of the lower substrate DS and the plurality of second substrates ST2 may be disposed in the non-display area NA of the lower substrate DS. Even though in FIG. 1, the plurality of second substrates ST2 is disposed at an upper side and a left side of the display area AA in the non-display area NA, it is not limited thereto and may be disposed in an arbitrary area of the non-display area NA.

The plurality of first substrates ST1 and the plurality of second substrates ST2 are rigid substrates and are spaced apart from each other to be independently disposed on the lower substrate DS. The plurality of first substrates ST1 and the plurality of second substrates ST2 may be more rigid than the lower substrate DS. That is, the lower substrate DS may have a flexible characteristic more than the plurality of first substrates ST1 and the plurality of second substrates ST2 and the plurality of first substrates ST1 and the plurality of second substrates ST2 may have a rigid characteristic more than the lower substrate DS.

The plurality of first substrates ST1 and the plurality of second substrates ST2 which are rigid substrates may be formed of a plastic material having flexibility and for example, may be formed of polyimide (PI), polyacrylate, or polyacetate. In this case, the plurality of first substrates ST1 and the plurality of second substrates ST2 may be formed of the same or substantially the same material, but are not limited thereto and may be formed of different materials.

Moduli of the plurality of first substrates ST1 and the plurality of second substrates ST2 may be higher than that of the lower substrate DS. The modulus is an elastic modulus which represents a ratio being deformed by a stress with respect to a stress applied to the substrate. The higher the modulus, the higher a degree of hardness. Therefore, the plurality of first substrates ST1 and the plurality of second substrates ST2 may be a plurality of rigid substrates having rigidity as compared with the lower substrate DS. The moduli of the plurality of first substrates ST1 and the plurality of second substrates ST2 may be 1000 times higher than the modulus of the lower substrate DS, but are not limited thereto. For example, elastic moduli of the plurality of first substrates ST1 and the plurality of second substrates ST2 may be 2 GPa to 9 GPa depending on a transparency. More specifically, when the plurality of first substrates ST1 and the plurality of second substrates ST2 are transparent, the elastic moduli is 2 GPa and when the plurality of first substrates ST1 and the plurality of second substrates ST2 are opaque, the elastic moduli is 9 GPa.

The COF 140 is a film on which various components are disposed on a base film 141 having a flexibility and supplies signals to the plurality of sub pixels of the display area AA. The COF 140 may be bond to the plurality of pads of the plurality of second substrates ST2 disposed in the non-display area NA and supplies a power voltage, a data voltage, or a gate voltage to the plurality of sub pixels of the display area AA through the pads. The COF 140 includes the base film 141 and a driving IC 142. Further, various components may be additionally disposed thereon.

The base film 141 is a layer which supports the driving IC 142 of the COF 140. The base film 141 may be formed of an insulating material, and for example, may be formed of an insulating material having a flexibility.

The driving IC 142 is a component which processes data for displaying images and a driving signal for processing the images. In FIG. 1, even though it is illustrated that the driving IC 142 is mounted by the COF 140 technique, it is not limited thereto and the driving IC 142 may be mounted by chip on glass (COG) or tape carrier package (TCP).

In FIG. 1, one second substrate ST2 is disposed in the non-display area NA at the upper side of the display area AA so as to correspond to one row of first substrates ST1 disposed in the display area AA and one COF 140 is disposed for one second substrate ST2, but is not limited thereto. That is, one second substrate ST2 and one COF 140 may be disposed so as to correspond to the first substrates ST1 in a plurality of rows.

A control unit such as an IC chip or a circuit unit may be mounted on the printed circuit board PCB. Further, on the printed circuit board PCB, a memory or a processor may also be mounted. The printed circuit board PCB is a component which transmits a signal for driving the display element from the control unit to the display element. Even though in FIG. 1, it is described that one printed circuit board PCB is used, the number of printed circuit boards PCB is not limited thereto.

Hereinafter, the stretchable display device 100 according to the embodiment of the present disclosure will be described in more detail with reference to FIGS. 2 and 3.

Planar and Cross-Sectional Structures

Figure 2:
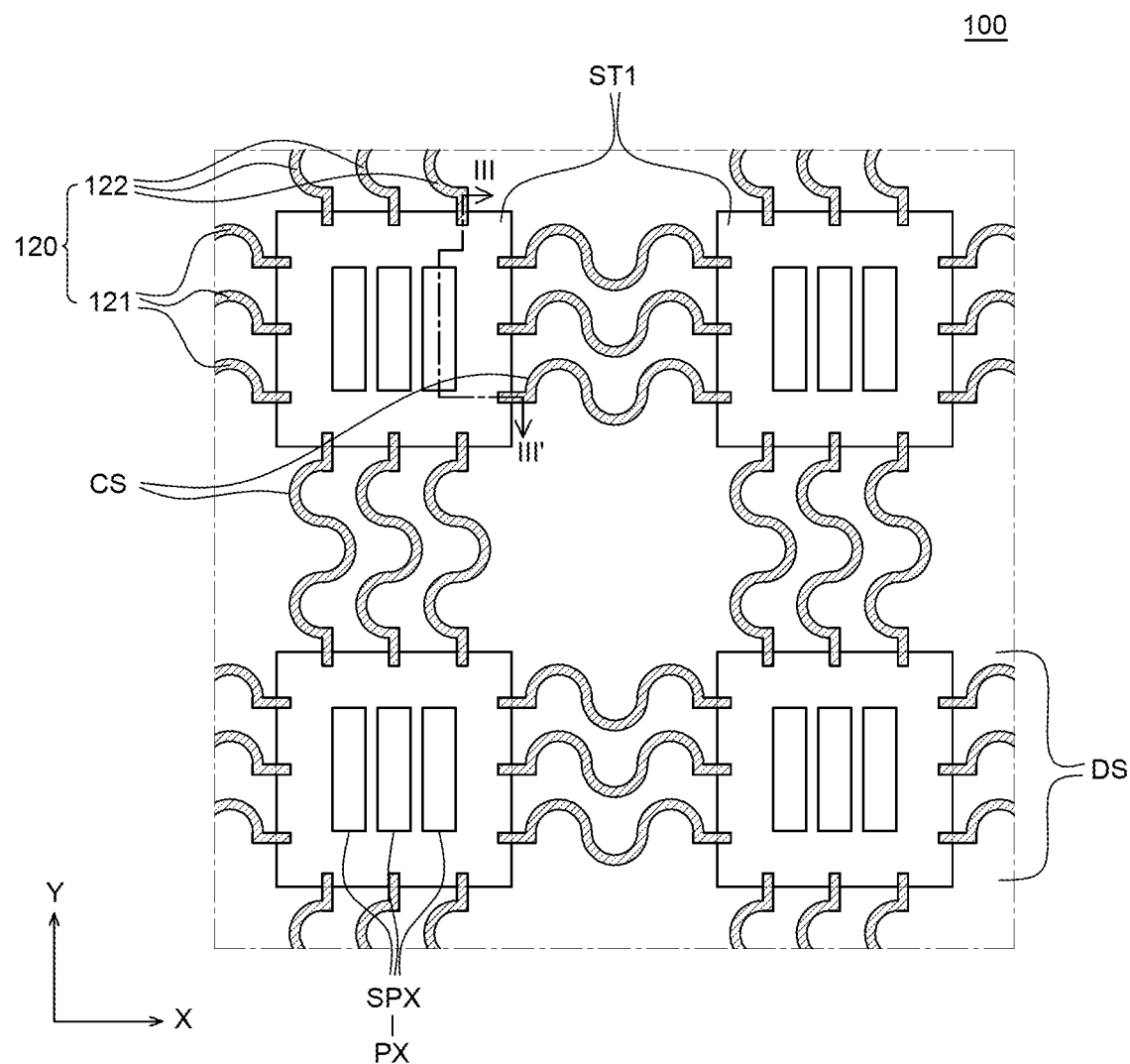
FIG. 2 is an enlarged plan view of a stretchable display device according to an embodiment of the present disclosure.

FIG. 2 is an enlarged plan view of a stretchable display device according to an embodiment of the present disclosure. FIG. 3 is a schematic cross-sectional view of one sub pixel of FIG. 2. For the convenience of description, the stretchable display device 100 according to the embodiment of the present disclosure will be described with reference to FIG. 1 together.

Figure 3:
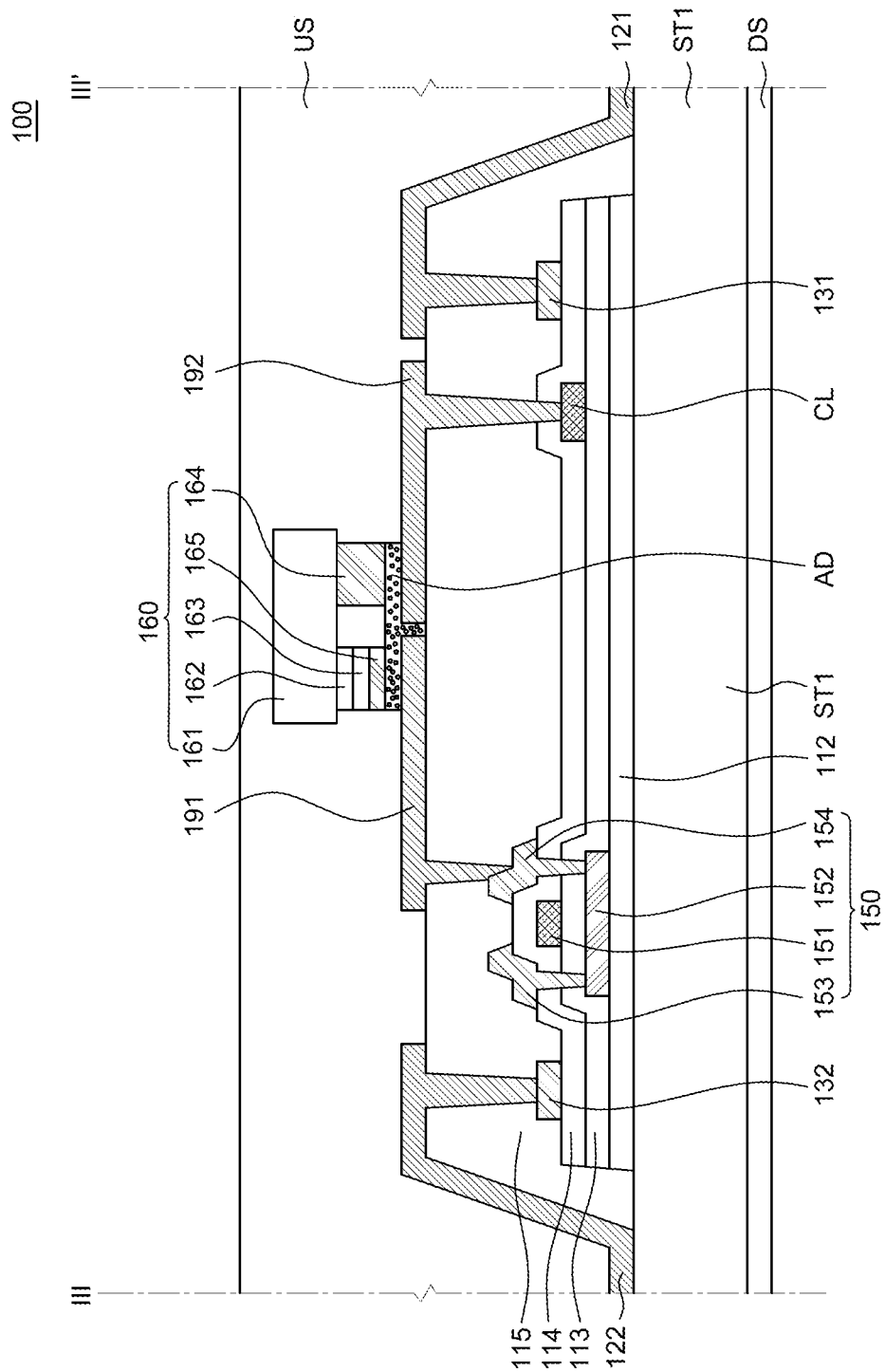
FIG. 3 is a schematic cross-sectional view of one sub pixel of FIG. 2.

Referring to FIGS. 2 and 3, the stretchable display device 100 includes a lower substrate DS, a plurality of first substrates ST1, a plurality of connection substrates CS, a plurality of connection lines 120, a plurality of pads (e.g., at least a first pad 131, at least a second pad 132, . . . ), a transistor 150, and an LED 160.

Referring to FIGS. 1 and 2, the plurality of first substrates ST1 is disposed on the lower substrate DS in the display area AA. The plurality of first substrates ST1 is spaced apart from each other to be disposed on the lower substrate DS. For example, as illustrated in FIGS. 1 and 2, the plurality of first substrates ST1 may be disposed on the lower substrate DS in a matrix, but is not limited thereto.

Referring to FIGS. 1 and 2, a plurality of sub pixels SPX which configures the plurality of pixels PX is disposed on the plurality of first substrates ST1 and a gate driver GD may be mounted on a second substrate ST2 located at a left side of the display area AA, among the plurality of second substrates ST2. The gate driver GD may be formed on the second substrate ST2 in a gate in panel (GIP) manner when various elements on the first substrate ST1 are manufactured. Therefore, various circuit configurations which configure the gate driver GD, such as various transistors, capacitors, and wiring lines may be disposed on the plurality of second substrates ST2. However, it is not limited thereto and the gate driver GD may be mounted in a chip on film (COF) manner. Further, the plurality of second substrates ST2 is also disposed in the non-display area NA located at a right side of the display area AA and the gate driver GD may be mounted also on the plurality of second substrates ST2 located at the right side of the display area AA.

Referring to FIG. 1, a size of the plurality of second substrates ST2 may be larger than a size of the plurality of first substrates ST1. Specifically, a size of each of the plurality of second substrates ST2 may be larger than a size of each of the plurality of first substrates ST1. As described above, on each of the plurality of second substrates ST2, the gate driver GD is disposed. For example, one stage STG of the gate driver GD may be disposed on each of the plurality of second substrates ST2. Therefore, an area occupied by various circuit configurations which configure one stage STG of the gate driver GD is relatively larger than an area of the first substrate ST1 on which the pixel PX is disposed. As a result, a size of each of the plurality of second substrates ST2 may be larger than a size of each of the plurality of first substrates ST1.

Referring to FIGS. 1 and 2, the plurality of connection substrates CS is disposed between the plurality of first substrates ST1, between the plurality of second substrates ST2, or between the plurality of first substrates ST1 and the plurality of second substrates ST2. The plurality of connection substrates CS may be substrates which connect adjacent first substrates ST1, adjacent second substrates ST2, or the first substrate ST1 and the second substrate ST2 which are adjacent to each other. The plurality of connection substrates CS may be simultaneously and integrally formed with the same material as the plurality of first substrates ST1 and the plurality of second substrates ST2, but is not limited thereto.

Referring to FIG. 2, the plurality of connection substrates CS has a wavy shape on a flat surface. For example, as illustrated in FIG. 2, the plurality of connection substrates CS may have a sine wave shape. However, the shape of the plurality of connection substrates CS is not limited thereto and for example, the plurality of connection substrates CS may extend with a zigzag pattern or may be formed with various shapes such as a shape extended by connecting a plurality of rhombus-shaped substrates at vertexes. Further, the number and the shape of the plurality of connection substrates CS illustrated in FIG. 2 are illustrative and the number and the shape of the plurality of connection substrates CS may vary depending on the design.

Referring to FIG. 3, a buffer layer 112 is disposed on the plurality of first substrates ST1. The buffer layer 112 is formed on the plurality of first substrates ST1 to protect various components of the stretchable display device 100 from permeation of moisture $H_2O$ and oxygen $O_2$ from the outside of the lower substrate DS and the plurality of first substrates ST1. The buffer layer 112 may be configured of an insulating material and for example, configured by a single layer or a double layer of an inorganic layer formed of silicon nitride (SiNx), silicon oxide (SiOx), and silicon oxynitride (SiON). However, the buffer layer 112 may be omitted depending on a structure or a characteristic of the stretchable display device 100.

The buffer layer 112 may be formed only in an area where the lower substrate DS overlaps with the plurality of first substrates ST1 and the plurality of second substrates ST2. As described above, the buffer layer 112 may be formed of an inorganic material so that the buffer layer 112 may be easily cracked or damaged during a process of extending the stretchable display device 100. In this case, the buffer layer 112 is not formed in an area between the plurality of first substrates ST1 and the plurality of second substrates ST2, but is patterned to have a shape of the plurality of first substrates ST1 and the plurality of second substrates ST2 to be disposed only above the plurality of first substrates ST1 and the plurality of second substrates ST2. In other words, the buffer layer 112 may not be formed on the plurality of connection substrates CS. Therefore, in the stretchable display device 100 according to the embodiment of the present disclosure, the buffer layer 112 is formed only in an area overlapping with the plurality of first substrates ST1 and the plurality of second substrates ST2 which are rigid substrates. Therefore, even though the stretchable display device 100 is bent or extended to be deformed, the damage of the buffer layer 112 may be suppressed.

Referring to FIG. 3, the transistor 150 including a gate electrode 151, an active layer 152, a source electrode 153, and a drain electrode 154 is formed on the buffer layer 112.

First, referring to FIG. 3, the active layer 152 is disposed on the buffer layer 112. For example, the active layer 152 may be formed of an oxide semiconductor, amorphous silicon (a-Si), polycrystalline silicon (poly-Si), or an organic semiconductor.

A gate insulating layer 113 is disposed on the active layer 152. The gate insulating layer 113 is a layer for electrically insulating the gate electrode 151 from the active layer 152 and may be formed of an insulating material. For example, the gate insulating layer 113 may be formed as a single layer of silicon nitride (SiNx) or silicon oxide (SiOx) which is an inorganic material or a multi-layer of silicon nitride (SiNx) or silicon oxide (SiOx), but it is not limited thereto.

The gate electrode 151 is disposed on the gate insulating layer 113. The gate electrode 151 is disposed to overlap with the active layer 152. The gate electrode 151 may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

An interlayer insulating layer 114 is disposed on the gate electrode 151. The interlayer insulating layer 114 is a layer which insulates the gate electrode 151 from the source electrode 153 and the drain electrode 154 and may be formed of an inorganic material, similarly to the buffer layer 112. For example, the interlayer insulating layer 114 may be configured by a single layer of silicon nitride (SiNx) or silicon oxide (SiOx) which is an inorganic material or a multi-layer of silicon nitride (SiNx) or silicon oxide (SiOx), but it is not limited thereto.

The source electrode 153 and the drain electrode 154 which are in contact with the active layer 152 are disposed on the interlayer insulating layer 114. The source electrode 153 and the drain electrode 154 are disposed on the same layer to be spaced apart from each other. The source electrode 153 and the drain electrode 154 may be in contact with the active layer 152 to be electrically connected to the active layer 152. The source electrode 153 and the drain electrode 154 may be any one of various metal materials such as molybdenum (Mo), aluminum (Al), chrome (Cr), gold (Au), titanium (Ti), nickel (Ni), neodymium (Nd), and copper (Cu) or an alloy of two or more of them, or a multi-layer thereof, but it is not limited thereto.

Further, the gate insulating layer 113 and the interlayer insulating layer 114 are patterned to be formed only in an area overlapping with the plurality of first substrates ST1. The gate insulating layer 113 and the interlayer insulating layer 114 may also be formed of the inorganic material, similarly to the buffer layer 112, so that the gate insulating layer 113 and the interlayer insulating layer 114 may also be easily cracked to be damaged during the process of extending the stretchable display device 100. Therefore, the gate insulating layer 113 and the interlayer insulating layer 114 are not formed in an area between the plurality of first substrates ST1, but are patterned to have a shape of the plurality of first substrates ST1 to be formed only above the plurality of first substrates ST1.

In FIG. 3, even though among various transistors which may be included in the stretchable display device 100, only a driving transistor is illustrated for the convenience of description, a switching transistor or a capacitor may also be included in the display device. Further, in this specification, even though it is described that the transistor 150 has a coplanar structure, various transistors such as a staggered transistor may also be used.

Referring to FIG. 3, a plurality of pads is disposed on the interlayer insulating layer 114. In the drawing, even though it is illustrated that the plurality of pads is disposed on the first substrates ST1, the plurality of pads may also be disposed on the second substrates ST2. The plurality of pads may be pads which transmit any one of various signals such as a gate signal, a data signal, an emission signal, a high potential power signal, a low potential power signal, a reference voltage signal, and a compensation signal to the plurality of sub pixels SPX, but is not limited thereto. Further, the plurality of pads may be formed of the same or substantially the same material as the source electrode 153 and the drain electrode 154, but is not limited thereto.

The plurality of pads includes a first pad 131 and a second pad 132. The first pad 131 may be connected to a first connection line 121. Further, the second pad 132 may be connected to a second connection line 122.

Referring to FIG. 3, a planarization layer 115 is formed on the transistor 150 and the interlayer insulating layer 114. The planarization layer 115 planarizes an upper portion of the transistor 150. The planarization layer 115 may be configured by a single layer or a plurality of layers and may be formed of an organic material. Therefore, the planarization layer 115 may also be referred to as an organic insulating layer. For example, the planarization layer 115 may be formed of an acrylic-based organic material, but is not limited thereto.

Referring to FIG. 3, the planarization layer 115 is disposed on the plurality of first substrates ST1 to cover top surfaces and side surfaces of the buffer layer 112, the gate insulating layer 113, and the interlayer insulating layer 114 to enclose the buffer layer 112, the gate insulating layer 113, and the interlayer insulating layer 114 together with the plurality of first substrates ST1. Specifically, the planarization layer 115 may be disposed so as to cover a top surface and a side surface of the interlayer insulating layer 114, a side surface of the gate insulating layer 113, a side surface of the buffer layer 112, and a part of a top surface of the plurality of first substrates ST1.

The planarization layer 115 may supplement a step on the side surfaces of the buffer layer 112, the gate insulating layer 113, and the interlayer insulating layer 114 and enhance an adhesive strength of the planarization layer 115 and the connection line 120 disposed on the side surface of the planarization layer 115. For example, the side surface of the planarization layer 115 may have a slope which is gentler than a slope formed by a side surface of the interlayer insulating layer 114, a side surface of the gate insulating layer 113, and a side surface of the buffer layer 112. Therefore, the connection line 120 which is disposed to be in contact with the side surface of the planarization layer 115 is disposed with a gentle slope so that when the stretchable display device 100 is stretched, a stress generated in the connection line 120 is reduced. Further, the crack occurring in the connection line 120 or a separation from the side surface of the planarization layer 115 may be suppressed.

In some embodiments, a passivation layer may be formed between the transistor 150 and the planarization layer 115. That is, the passivation layer may be formed to cover the transistor 150 to protect the transistor 150 from the permeation of the moisture and oxygen. The passivation layer may be formed of an inorganic material and configured by a single layer or a plurality of layers, but is not limited thereto.

Referring to FIG. 3, a common line CL is disposed on the gate insulating layer 113. The common line CL is a wiring line which applies a common voltage to the plurality of sub pixels SPX. The common line CL may be formed of the same or substantially the same material as the gate electrode 151 of the transistor 150, but is not limited thereto.

Referring to FIG. 3, the first connection pad 191 and the second connection pad 192 are disposed on the planarization layer 115. The first connection pad 191 is an electrode which electrically connects an LED 160 to be described below and the transistor 150. For example, the first connection pad 191 may electrically connect the drain electrode 154 of the transistor 150 and the LED 160 through a contact hole formed in the planarization layer 115.

The second connection pad 192 is an electrode which electrically connects the LED 160 and the common line CL. For example, the second connection pad 192 may electrically connect the common line CL and the LED 160 through the contact hole formed in the planarization layer 115.

Referring to FIG. 3, the LED 160 is disposed on the first connection pad 191 and the second connection pad 192. The LED 160 includes an n-type layer 161, an active layer 162, a p-type layer 163, an n-electrode 164, and a p-electrode 165. The LED 160 of the stretchable display device 100 according to the embodiment of the present disclosure has a flip-chip structure in which the n-electrode 164 and the p-electrode 165 are formed on one surface.

The n-type layer 161 may be formed by injecting an n-type impurity into gallium nitride (GaN). The n-type layer 161 may be disposed on a separate base substrate which is formed of a material which is capable of emitting light.

The active layer 162 is disposed on the n-type layer 161. The active layer 162 is a light emitting layer which emits light in the LED 160 and may be formed of a nitride semiconductor, for example, indium gallium nitride (InGaN). The p-type layer 163 is disposed on the active layer 162. The p-type layer 163 may be formed by injecting a p-type impurity into gallium nitride (GaN).

As described above, the LED 160 according to the embodiment of the present disclosure is manufactured by sequentially laminating the n-type layer 161, the active layer 162, and the p-type layer 163, and then etching a predetermined part to form the n-electrode 164 and the p-electrode 165. In this case, the predetermined part which is a space for separating the n-electrode 164 and the p-electrode 165 from each other may be etched to expose a part of the n-type layer 161. In other words, the surfaces of the LED 160 on which the n-electrode 164 and the p-electrode 165 are disposed are not flat surfaces, but have different height levels.

As described above, in the etched area, in other words, on the n-type layer 161 exposed by the etching process, the n-electrode 164 is disposed. The n-electrode 164 may be formed of a conductive material. In the meantime, in an area which is not etched, in other words, on the p-type layer 163, the p-electrode 165 is disposed. The p-electrode 165 may also be formed of a conductive material, for example, may be formed of the same or substantially the same material as the n-electrode 164. The p-electrode 165 and the n-electrode 164 described above may be defined as a first electrode and a second electrode of the LED 160, respectively.

An adhesive layer AD is disposed on top surfaces of the first connection pad 191 and the second connection pad 192 and between the first connection pad 191 and the second connection pad 192 so that the LED 160 may be bonded onto the first connection pad 191 and the second connection pad 192. In this case, the n-electrode 164 may be disposed on the second connection pad 192 and the p-electrode 165 may be disposed on the first connection pad 191.

The adhesive layer AD may be a conductive adhesive layer in which conductive balls are dispersed in an insulating base member. Therefore, when heat or pressure is applied to the adhesive layer AD, the conductive balls are electrically connected in a portion applied with heat or pressure to have a conductive property and an area which is not pressurized may have an insulating property. For example, the n-electrode 164 is electrically connected to the second connection line 122 by means of the adhesive layer AD and the p-electrode 165 is electrically connected to the first connection line 121 by means of the adhesive layer AD. That is, after applying the adhesive layer AD on the first connection pad 191 and the second connection pad 192 using an inkjet method, the LED 160 is transferred onto the adhesive layer AD and the LED 160 is pressurized and heated. By doing this, the first connection pad 191 may be electrically connected to the p-electrode 165 and the second connection pad 192 may be electrically connected to the n-electrode 164. However, another part of the adhesive layer AD excluding a part of the adhesive layer AD disposed between the n-electrode 164 and the second connection pad 192 and a part of the adhesive layer AD disposed between the p-electrode 165 and the first connection pad 191 has an insulating property.

In the meantime, the adhesive layer AD may be divided to be disposed on the first connection pad 191 and the second connection pad 192, respectively. That is, the adhesive layer AD disposed between the p-electrode 165 and the first connection pad 191 may be defined as a first adhesive pattern and the adhesive layer AD disposed between the n-electrode 164 and the second connection pad 192 may be defined as a second adhesive pattern.

As described above, the stretchable display device 100 according to the embodiment of the present disclosure has a structure in which the LED 160 is disposed on the lower substrate DS on which the transistor 150 is disposed. Therefore, when the stretchable display device 100 is turned on, different voltage levels which are applied to the first connection pad 191 and the second connection pad 192 are transmitted to the n-electrode 164 and the p-electrode 165 so that the LED 160 emits light.

In the meantime, even though in FIG. 3, it is illustrated that a bank is not used, the bank may be formed on the first connection pad 191, the second connection pad 192, the connection line 120, and the planarization layer 115. The bank may divide sub pixels which are disposed on one side and the other side of the LED 160 to be adjacent to each other. The bank may be formed of an insulating material. Further, the bank may include a black material. The bank includes the black material to block wiring lines which may be visible through the display area AA. For example, the bank may be formed of a transparent carbon-based mixture and specifically, include carbon black. However, it is not limited thereto and the bank may be formed of a transparent insulating material.

Referring to FIGS. 1 and 3, the upper substrate US is disposed on the LED 160 and the lower substrate DS. The upper substrate US is a substrate which supports various components disposed below the upper substrate US. Specifically, the upper substrate US is formed by coating a material which configures the upper substrate US on the lower substrate DS and then curing the material to be disposed to be in contact with the lower substrate DS, the first substrate ST1, the second substrate ST2, and the connection substrate CS.

The upper substrate US, which is a flexible substrate, may be configured by an insulating material which is bendable or stretchable. The upper substrate US is a flexible substrate so as to be reversibly expanded and contracted. Further, an elastic modulus of the upper substrate may be several MPa to several hundreds of MPa and a ductile breaking ratio may be 100% or higher. A thickness of the upper substrate US may be 10 μm to 1 mm, but is not limited thereto.

The upper substrate US may be formed of the same or substantially the same material as the lower substrate DS. For example, the upper substrate US may be formed of a silicon rubber such as polydimethylsiloxane (PDMS) or an elastomer such as polyurethane (PU) or polytetrafluoroethylene (PTFE) and thus have a flexible property. However, the material of the upper substrate US is not limited thereto.

In the meantime, even though not illustrated in FIG. 3, a polarization layer may be disposed on the upper substrate US. The polarization layer may perform a function which polarizes light incident from the outside of the stretchable display device 100 to reduce the external light reflection. Further, an optical film other than the polarization layer may be disposed on the upper substrate US.

Referring to FIGS. 2 and 3, the plurality of connection lines 120 is disposed on the planarization layer 115 and the plurality of connection substrates CS. The plurality of connection lines 120 refers to wiring lines which electrically connect a plurality of pads which is adjacent to each other. In this case, the connection line 120 and the pad may be connected to each other through a contact hole formed in the planarization layer 115. The plurality of connection lines 120 may be configured by one of various wiring lines such as a gate line, a data line, an emission signal line, a high potential power line, a low potential power line, a reference voltage line, and a compensation signal line, but is not limited thereto.

The plurality of connection lines 120 is disposed between two adjacent first substrates ST1 to electrically connect two first substrates ST1. Specifically, the plurality of connection lines 120 is disposed on the connection substrate CS which connects two adjacent first substrates ST1 and two adjacent second substrates ST2. Further, the plurality of connection lines 120 may be disposed between two adjacent second substrates ST2 and between the first substrate ST1 and the second substrate ST2 which are adjacent to each other.

In an area corresponding to the connection substrates CS, the plurality of connection lines 120 is formed to have the same or substantially the same shape as the plurality of connection substrates CS to overlap with each other. That is, the plurality of connection lines 120 may have the same wavy shape as the plurality of connection substrates CS above the plurality of connection substrates CS.

The plurality of connection lines 120 includes the first connection line 121 and the second connection line 122. The first connection line 121 and the second connection line 122 may be disposed between the plurality of first substrates ST1, between the plurality of second substrates ST2, or between the plurality of first substrates ST1 and the plurality of second substrates ST2.

The first connection line 121 may be formed to extend to a top surface of the connection substrate CS while being in contact with a top surface and a side surface of the planarization layer 115 disposed on the first substrate ST1. Further, the second connection line 122 may be formed to extend to the top surface of the connection substrate CS while being in contact with a top surface and a side surface of the planarization layer 115 disposed on the first substrate ST1.

In FIGS. 1 and 2, the first connection line 121 may refer to a wiring line extending in an X-axis direction among the plurality of connection lines 120 and the second connection line 122 refers to a wiring line extending in a Y-axis direction among the plurality of connection lines 120. The first connection line 121 and the second connection line 122 may be configured to transmit different signals to the plurality of sub pixels SPX. That is, a signal transmitted by the first connection line 121 may be different from a signal transmitted by the second connection line 122.

The plurality of connection lines 120 may be formed of a metal material such as copper (Cu), aluminum (Al), titanium (Ti), and molybdenum (Mo) or a stacked structure of metal materials such as copper/molybdenum-titanium (Cu/Moti) or titanium/aluminum/titanium (Ti/Al/Ti), but is not limited thereto.

The display device includes various signal lines such as a gate line, a data line, an emission signal line, a high potential power line, a low potential power line, a reference voltage line, or a compensation signal line. In the case of a general display device, various signal lines extend as a straight line between the plurality of sub pixels and the plurality of sub pixels is connected to one signal line. Therefore, in the general display device, various signal lines extend from one side of the display device to the other side without being disconnected on the substrate.

In contrast, in the case of the stretchable display device 100 according to the embodiment of the present disclosure, a straight signal line which is considered to be used for the general display device is disposed only on the plurality of first substrates ST1 and the plurality of second substrates ST2. That is, in the stretchable display device 100 according to the embodiment of the present disclosure, a straight signal line is disposed only on the plurality of first substrates ST1 and the plurality of second substrates ST2.

In the stretchable display device 100 according to the embodiment of the present disclosure, in order to connect discontinuous wiring lines on the first substrate ST1 or the second substrate ST2, the pads on the adjacent substrates ST1 and ST2 may be connected by the connection lines 120. That is, the connection line 120 electrically connects pads on two adjacent first substrates ST1, on two adjacent second substrates ST2, and on the first substrate ST1 and the second substrate ST2. Therefore, in the stretchable display device 100 according to the embodiment of the present disclosure, straight signal lines on the plurality of first substrates ST1 and the plurality of second substrates ST2 may be electrically connected to each other by the plurality of connection lines 120.

For example, the gate line may be disposed on the plurality of first substrates ST1 disposed to be adjacent to each other in the X-axis direction and the gate pad may be disposed on both ends of the gate line. For example, the first pad 131 may be one of gate pads disposed on both ends of the gate line of the sub pixel SPX. The first connection line 121 may serve as a gate line. Further, the first pad 131 on the plurality of first substrates ST1 which are adjacent to each other in the X-axis direction may be connected to each other by the first connection line 121 on the connection substrate CS. Therefore, the gate line disposed on the plurality of first substrates ST1 and the first connection line 121 disposed on the connection substrate CS may serve as one gate line. Accordingly, one gate signal may be transmitted to the gate electrode 151 of the plurality of sub pixels SPX through the first pad 131, the first connection line 121, and the gate lines disposed on the plurality of first substrates ST1.

Further, the data line may be disposed on the plurality of first substrates ST1 disposed to be adjacent to each other in the Y-axis direction and a data pad may be disposed on both ends of the data line. For example, the second pad 132 may be one of data pads disposed on both ends of the data line of the sub pixel SPX. The second connection line 122 may serve as a data line. Further, the second pad 132 on the plurality of first substrates ST1 which are adjacent to each other in the Y-axis direction and another pad may be connected to each other by the second connection line 122 on the connection substrate CS. Therefore, the data line disposed on the plurality of first substrates ST1 and the second connection line 122 disposed on the connection substrate CS may serve as one data line. Accordingly, one data signal may be transmitted to the plurality of sub pixels SPX through the second pad 132, another pad, the second connection line 122, and the data lines disposed on the plurality of first substrates ST1.

Further, the connection line 120 may further include a wiring line which connects pads on the plurality of first substrates ST1 and the plurality of second substrates ST2 to each other or connects pads on two second substrates ST2 which are disposed to be parallel, among pads on the plurality of second substrates ST2 adjacent in the Y-axis direction.

First Sink Pattern

Figure 4:
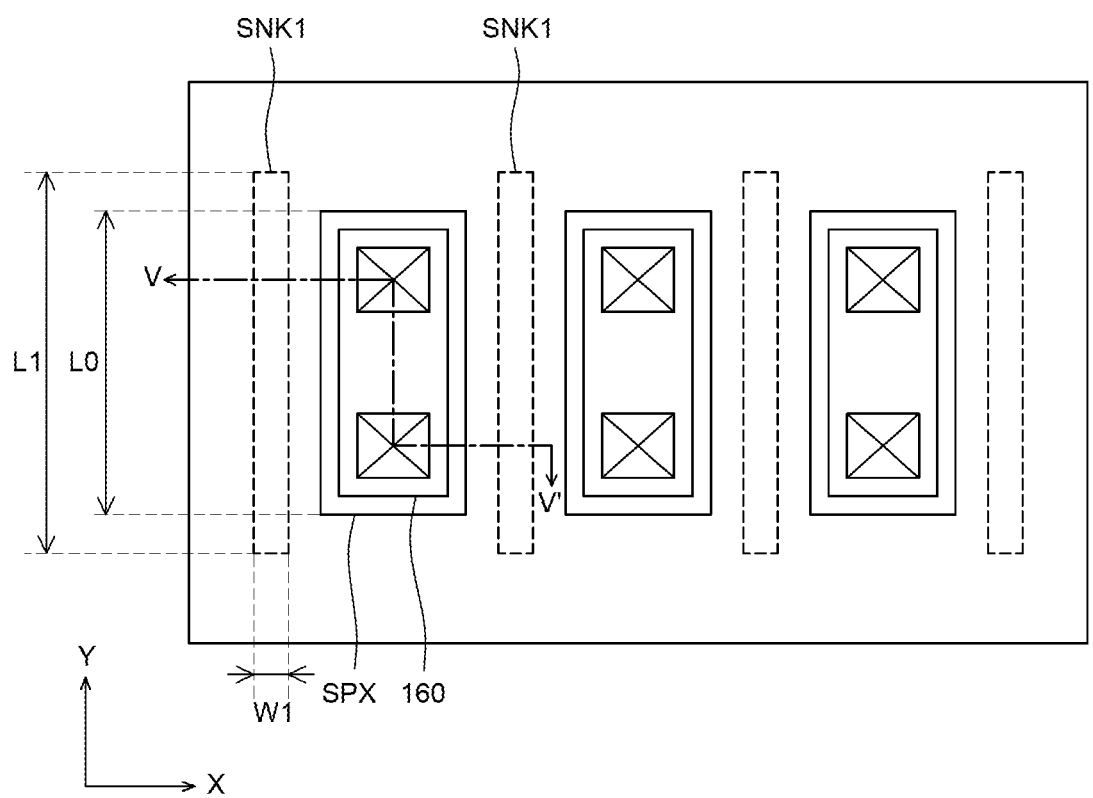
FIG. 4 is a plan view illustrating one pixel of a stretchable display device according to an embodiment of the present disclosure.
Figure 5:
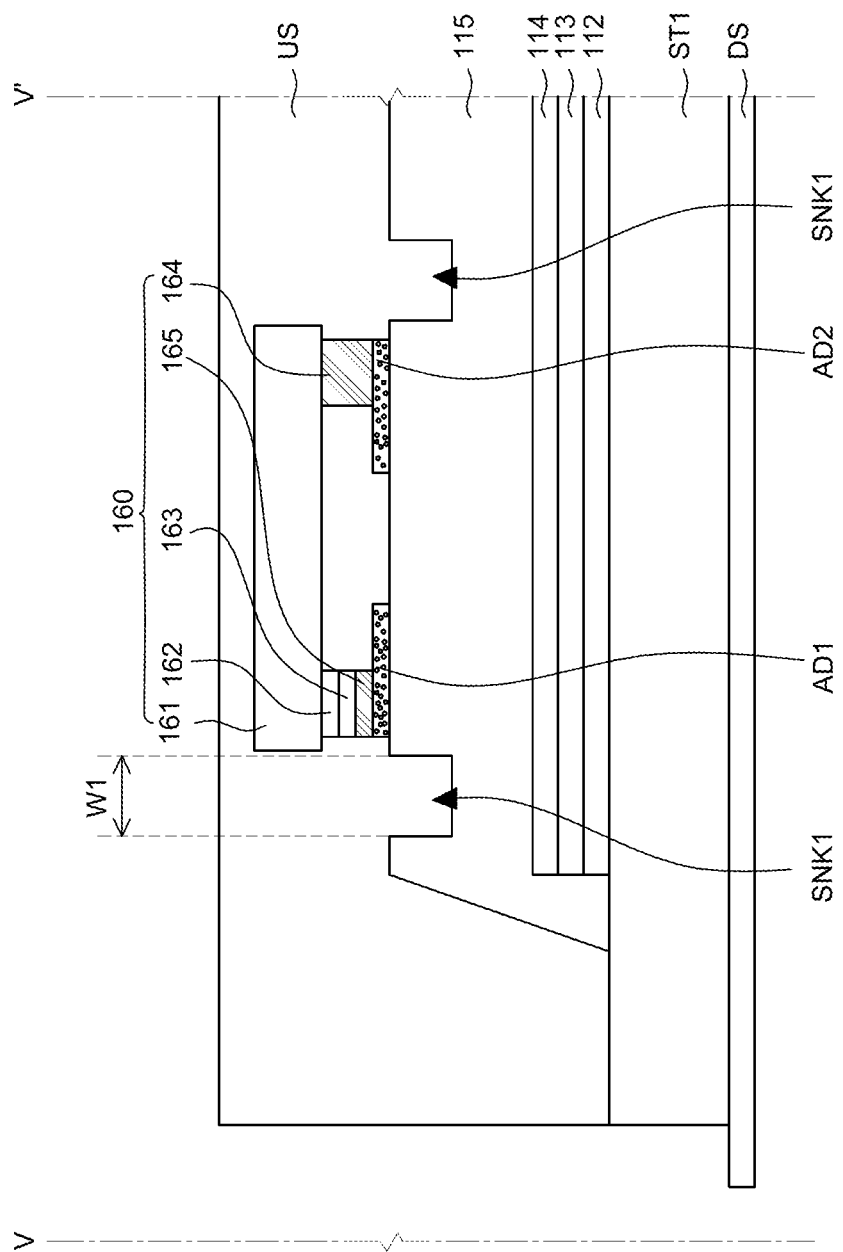
FIG. 5 is a cross-sectional view taken along the line V-V' of FIG. 4.

FIG. 4 is a plan view illustrating one pixel of a stretchable display device according to an embodiment of the present disclosure. FIG. 5 is a cross-sectional view taken along the line V-V' of FIG. 4. For the convenience of description, in FIGS. 4 and 5, the connection line 120, the plurality of pads 131 and 132, and the plurality of connection pads 191 and 192 which are illustrated in FIG. 3 are not illustrated.

Referring to FIG. 4, in the stretchable display device 100, a first sink pattern SNK1 may be formed in an area between the plurality of sub pixels SPX. That is, referring to FIG. 5, the planarization layer 115 may include at least one first sink pattern SNK1 which is formed at a side portion of the LED 160 which is a light emitting diode disposed in the plurality of sub pixels SPX.

In FIG. 4, it is illustrated that only one first sink pattern SNK1 is disposed between the plurality of sub pixels SPX. However, the present disclosure is not limited thereto and depending on a necessity for a design of the stretchable display device, a plurality of first sink patterns SNK1 is disposed between the plurality of sub pixels SPX or no first sink pattern may be disposed between the plurality of sub pixels SPX.

As illustrated in FIGS. 4 and 5, the LED 160 which is provided in each sub pixel SPX includes a p-electrode 165 which is a first electrode and an n-electrode 164 which is a second electrode. Further, the first electrode 165 and the second electrode 164 are disposed in a Y direction. Therefore, as illustrated in FIG. 4, the LED 160 may extend in one direction (e.g., Y direction). That is, the LED 160 may have a length in the Y direction.

Further, as described above, the p-electrode 165 of the LED 160 may be attached by the first adhesive pattern AD1 and the n-electrode 164 of the LED 160 may be attached by the second adhesive pattern AD2. Further, the first adhesive pattern AD1 and the second adhesive pattern AD2 may be conductive adhesive patterns in which conductive balls are dispersed in an insulating base member. Generally, the conductive balls which electrically connect the p-electrode 165 and the n-electrode 164 of the LED 160 may have a diameter of 2 µm to 3 µm.

Based on the above description, a length of the first sink pattern SNK1 in one direction (e.g., Y direction) may be larger than a length of the LED 160. Further, a width W1 of the first sink pattern SNK1 in the other direction (e.g., X direction) which is perpendicular to one direction may be larger than diameters of the conductive balls of the first adhesive pattern AD1 and the second adhesive pattern AD2. That is, the width W1 of the first sink pattern SNK1 may be 3 µm or larger, but it is just an example and the width W1 of the first sink pattern SNK1 may vary depending on a diameter of the conductive ball.

As described above, the p-electrode 165 of the LED 160 and the second connection pad 192 and the n-electrode 164 may be electrically connected by heating the LED after transferring the LED 160 onto the adhesive patterns AD1 and AD2 and pressurizing the LED 160. Unlike the stretchable display device according to the embodiment of the present disclosure, when the plurality of first sink patterns SNK1 is not formed on the planarization layer 115, during the process of pressurizing the LED 160, the adhesive patterns AD1 and AD2 overflow onto the adjacent sub pixels SPX. Therefore, there may be a problem in that the adhesive patterns are electrically connected to the adjacent sub pixels SPX. Further, during the process of pressurizing the LED 160, the adhesive patterns AD1 and AD2 overflow to an area beyond the first substrate ST1 so that the adhesive patterns AD1 and AD2 may invade the lower substrate DS in which the first substrate ST1 is not disposed. Thereafter, after the heating process, the adhesive patterns AD1 and AD2 which invade the lower substrate DS in which the first substrate ST1 is not disposed are hardened so that the lower substrate has a predetermined rigidity. Therefore, the lower substrate DS in which the first substrate ST1 is not disposed needs to be bendable or stretchable, but the lower substrate DS does not extend due to the invaded adhesive patterns AD1 and AD2. That is, the adhesive patterns AD1 and AD2 invade the lower substrate DS in which the first substrate ST1 is not disposed so that there is a problem in that the extension rate of the stretchable display device is significantly lowered.

Therefore, in the display device according to the embodiment of the present disclosure, the plurality of first sink patterns SNK1 is formed at a side portion of the sub pixel SPX on the planarization layer 115 so that during the process of pressurizing the LED 160, the adhesive patterns AD1 and AD2 are suppressed so as not to overflow to an area beyond the first substrate ST1. That is, the adhesive patterns AD1 and AD2 are trapped in the first sink pattern SNK1.

Further, the length of the first sink pattern SNK1 in one direction (e.g., Y direction) is formed to be larger than the length of the LED 160 so that the adhesive patterns AD1 and AD2 disposed below the LED 160 may not invade through an upper portion and a lower portion of the first sink pattern SNK1.

Further, the width of the first sink pattern SNK1 is formed to be larger than the diameter of each of the conductive balls of the first adhesive pattern AD1 and the second adhesive pattern AD2 so that the adhesive patterns AD1 and AD2 may be trapped in the first sink pattern SNK1.

If the width of the first sink pattern SNK1 is smaller than the diameter of each of the conductive balls of the first adhesive pattern AD1 and the second adhesive pattern AD2, the conductive balls block the upper portion of the first sink pattern SNK1 so that the adhesive patterns AD1 and AD2 are not trapped by the first sink pattern SNK1. Accordingly, the width of the first sink pattern SNK1 needs to be formed to be larger than the diameter of each of the conductive balls of the first adhesive pattern AD1 and the second adhesive pattern AD2. By doing this, the adhesive patterns AD1 and AD2 may not overflow to the area beyond the first substrate ST1 during the process of pressurizing the LED 160.

Figure 6:
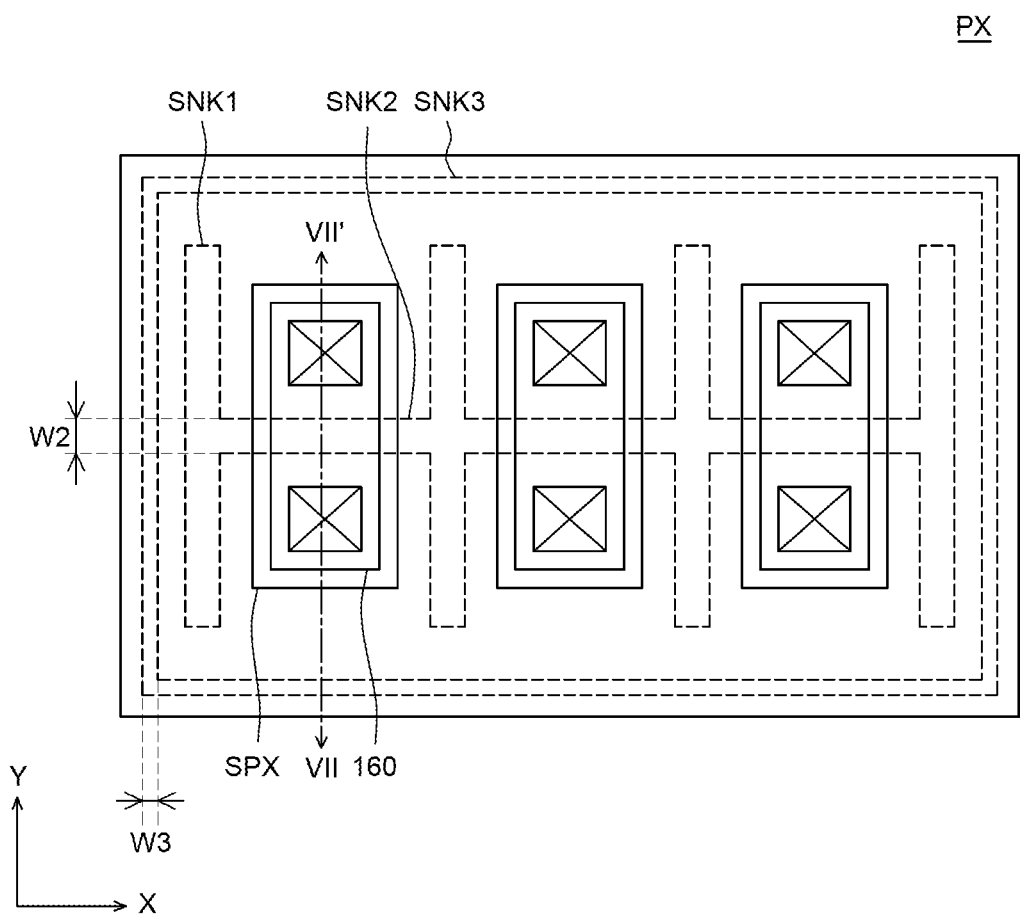
FIG. 6 is a plan view illustrating one pixel of a stretchable display device according to another embodiment of the present disclosure.
Figure 7:
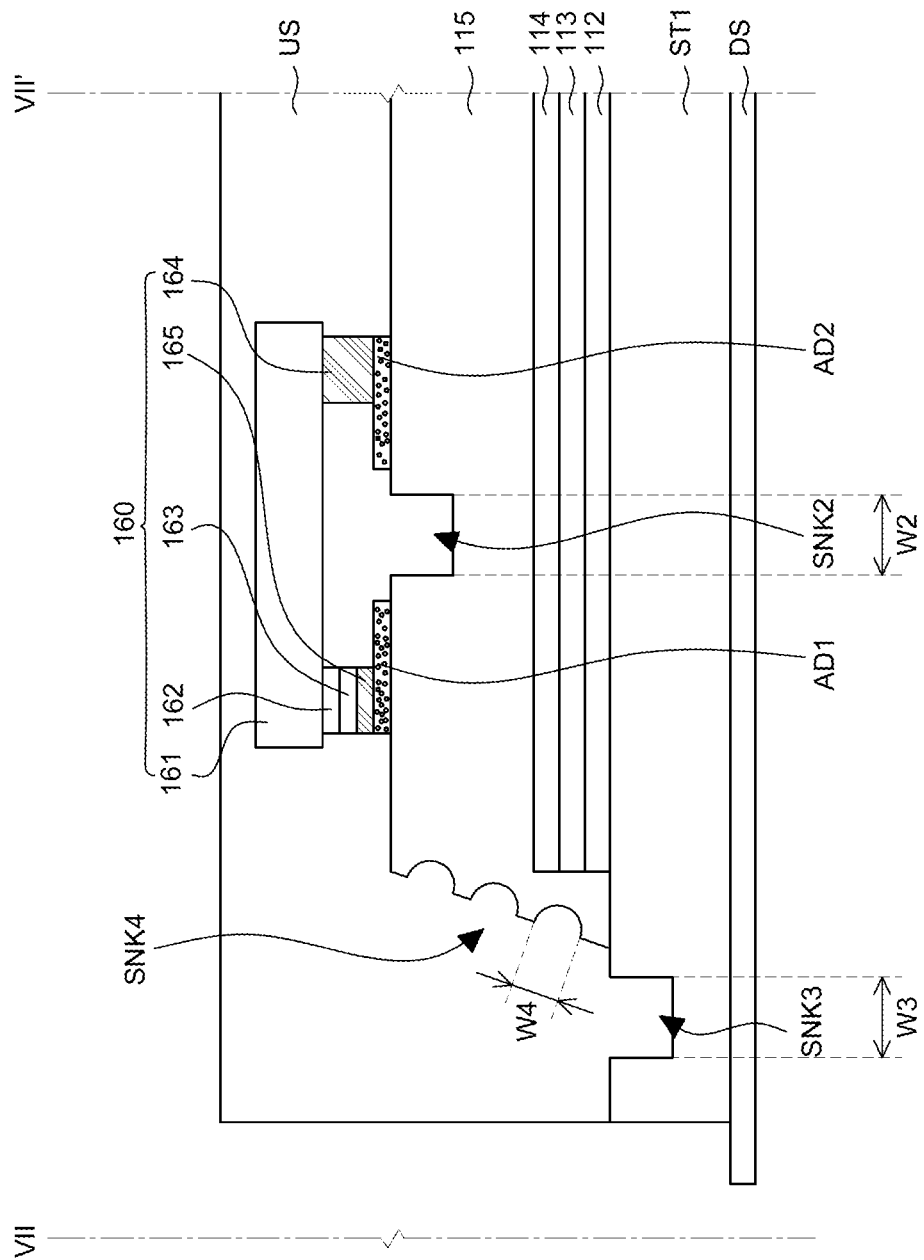
FIG. 7 is a cross-sectional view taken along the line VII-VII' of FIG. 6.

Another Embodiment of Present Disclosure—Second Sink Pattern to Fourth Sink Pattern FIG. 6 is a plan view illustrating one pixel of a stretchable display device according to another embodiment of the present disclosure. FIG. 7 is a cross-sectional view taken along the line VII-VII' of FIG. 6. For the convenience of description, in FIGS. 6 and 7, the connection line 120, the plurality of pads 131 and 132, and the plurality of connection pads 191 and 192 which are illustrated in FIG. 3 are not illustrated. Components of another embodiment of the present disclosure are same as the components of one embodiment of the present disclosure except that second sink pattern SNK2 to fourth sink pattern SNK4 are added. Therefore, the second sink pattern SNK2 to fourth sink pattern SNK4 will be described in detail.

Referring to FIGS. 6 and 7, a stretchable display device according to another embodiment of the present disclosure may further include a second sink pattern SNK2 which passes through the plurality of sub pixels SPX, a third sink pattern SNK3 which encloses an outer peripheral area of the pixel PX, and a fourth sink pattern SNK4 which is formed on a slope surface of the planarization layer 115.

To be more specific, the second sink pattern SNK2 is formed on the planarization layer 115 in an area between the first adhesive pattern AD1 and the second adhesive pattern AD2 or an area between the p-electrode 165 which is a first electrode and the n-electrode 164 which is a second electrode. Further, the second sink pattern SNK2 extends in the other direction (e.g., X direction) to be connected to the first sink pattern SNK1 which extends in one direction.

Therefore, the second sink pattern SNK2 which is connected to the first sink pattern SNK1 is formed so that the adhesive patterns AD1 and AD2 which are trapped in the first sink pattern SNK1 may flow into the second sink pattern SNK2. Therefore, an adhesive pattern (AD1 and AD2) accommodating ability to trap the adhesive patterns AD1 and AD2 which flow during the pressurizing process is improved. Accordingly, the adhesive patterns AD1 and AD2 may be trapped more in the first sink pattern SNK1 and the second sink pattern SNK2.

Further, the third sink pattern SNK3 is formed on the first substrate ST1 so as to enclose the outer peripheral area of the pixel PX. That is, the third sink pattern SNK3 is disposed in an outer peripheral area of the first substrate ST1 on which the planarization layer 115 is not disposed.

However, even though in FIG. 6, it is illustrated that the third sink pattern SNK3 is continuous as one band shape which encloses the first substrate ST1, the present disclosure is not limited thereto and the third sink pattern SNK3 may be divided into a plurality of sink patterns.

Further, the fourth sink pattern SNK4 may be formed on a slope surface of the planarization layer 115. To be more specific, the fourth sink pattern SNK4 may be formed on the slope surface of the planarization layer 115 as a pattern which extends along a direction in which the slope surface of the planarization layer 115 extends. Further, the plurality of fourth sink patterns SNK4 may be formed and each fourth sink pattern SNK4 may extend in parallel along a direction in which the slope surface of the planarization layer 115 extends.

As described above, the third sink pattern SNK3 and the fourth sink pattern SNK4 are formed so that the adhesive patterns AD1 and AD2 do not overflow to the area beyond the first substrate ST1 during the process of pressurizing the LED 160. That is, both the third sink pattern SNK3 and the fourth sink pattern SNK4 are disposed in a path where the adhesive patterns AD1 and AD2 invade the outside of the first substrate ST1. Therefore, during the process of pressurizing the LED 160, when the adhesive patterns AD1 and AD2 overflow to the outside of the first substrate ST1, the adhesive patterns AD1 and AD2 are trapped by the third sink pattern SNK3 and the fourth sink pattern SNK4. Accordingly, the adhesive patterns AD1 and AD2 do not invade the lower substrate DS which is disposed at the outside of the first substrate ST1. By doing this, even though the stretchable display device of the present disclosure is subjected to a heating process, the degradation of the extension rate does not occur.

Further, a width W2 of the second sink pattern SNK2, a width W3 of the third sink pattern SNK3, and a width W4 of the fourth sink pattern SNK4 may be larger than diameters of the conductive balls of the first adhesive pattern AD1 and the second adhesive pattern AD2. That is, the width W2 of the second sink pattern SNK2, the width W3 of the third sink pattern SNK3, and the width W4 of the fourth sink pattern SNK4 may be 3 μm or larger, but these are just an example. Therefore, the width W2 of the second sink pattern SNK2, the width W3 of the third sink pattern SNK3, and the width W4 of the fourth sink pattern SNK4 may vary depending on the diameter of each of the conductive balls.

If the width W2 of the second sink pattern SNK2, the width W3 of the third sink pattern SNK3, and the width W4 of the fourth sink pattern SNK4 are smaller than the diameter of each of the conductive balls of the first adhesive pattern AD1 and the second adhesive pattern AD2, the conductive balls block the upper portions of the second sink pattern SNK2, the third sink pattern SNK3, and the fourth sink pattern SNK4. Therefore, the second sink pattern SNK2, the third sink pattern SNK3, and the fourth sink pattern SNK4 may not trap the adhesive patterns AD1 and AD2. Accordingly, the width W2 of the second sink pattern SNK2, the width W3 of the third sink pattern SNK3, and the width W4 of the fourth sink pattern SNK4 need to be larger than the diameter of each of the conductive balls of the first adhesive pattern AD1 and the second adhesive pattern AD2. By doing this, the adhesive patterns AD1 and AD2 do not overflow to the area beyond the first substrate ST1 during the process of pressurizing the LED 160.

Still Another Embodiment of Present Disclosure—at Least One Dam

Figure 8:
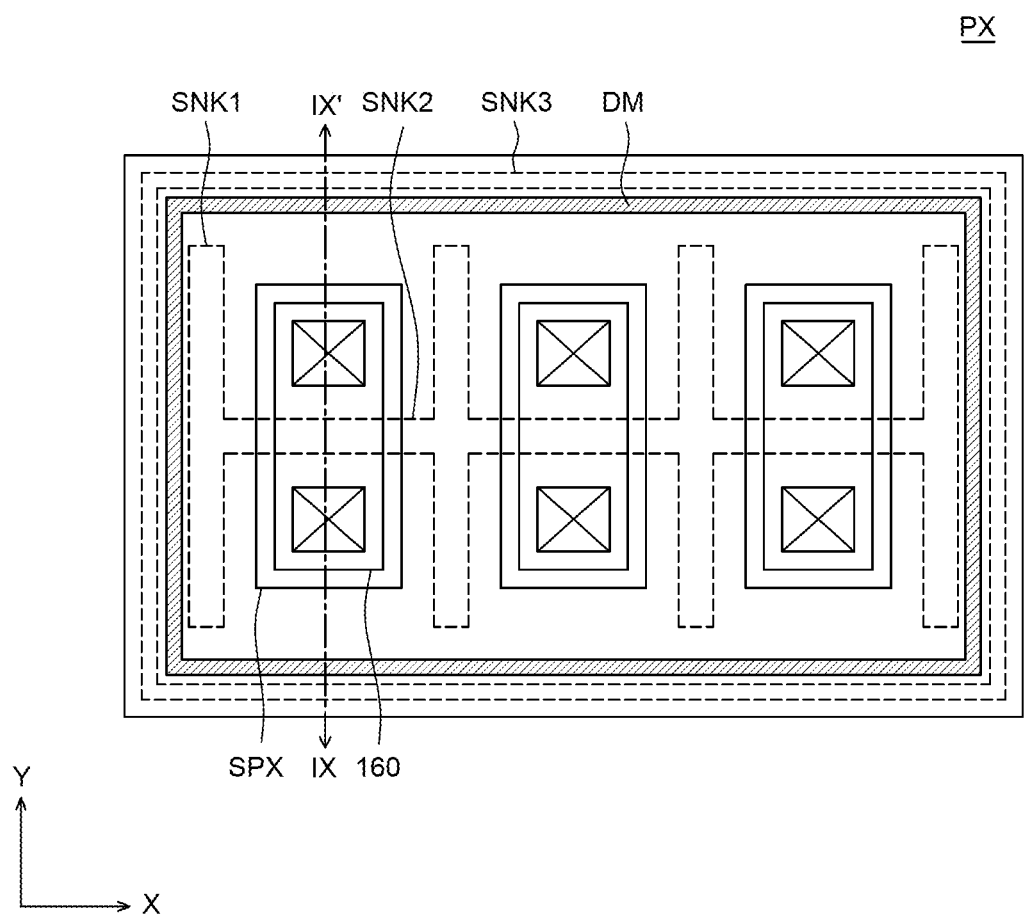
FIG. 8 is a plan view illustrating one pixel of a stretchable display device according to still another embodiment of the present disclosure.
Figure 9:
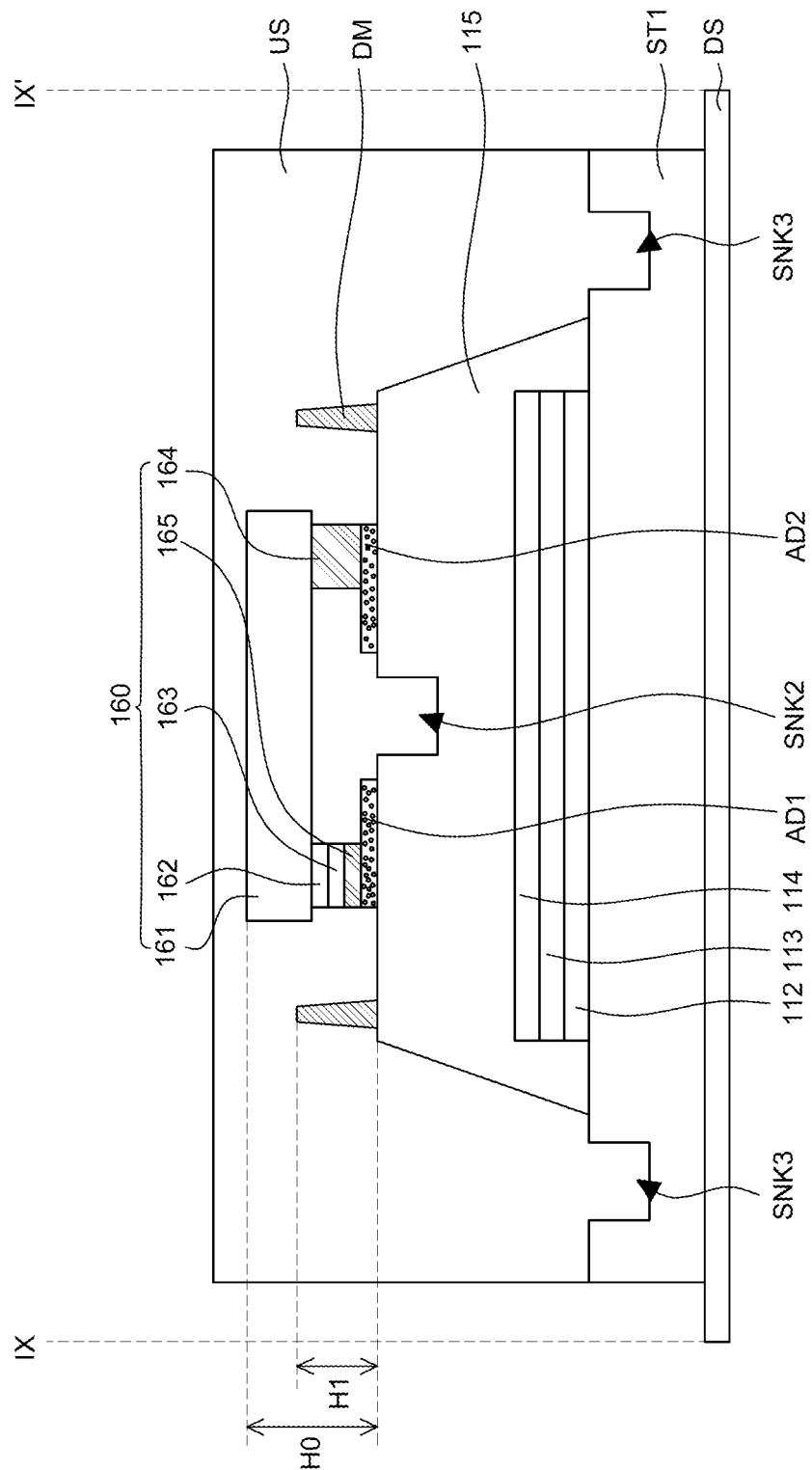
FIG. 9 is a cross-sectional view taken along the line IX-IX' of FIG. 8.
Figure 10:
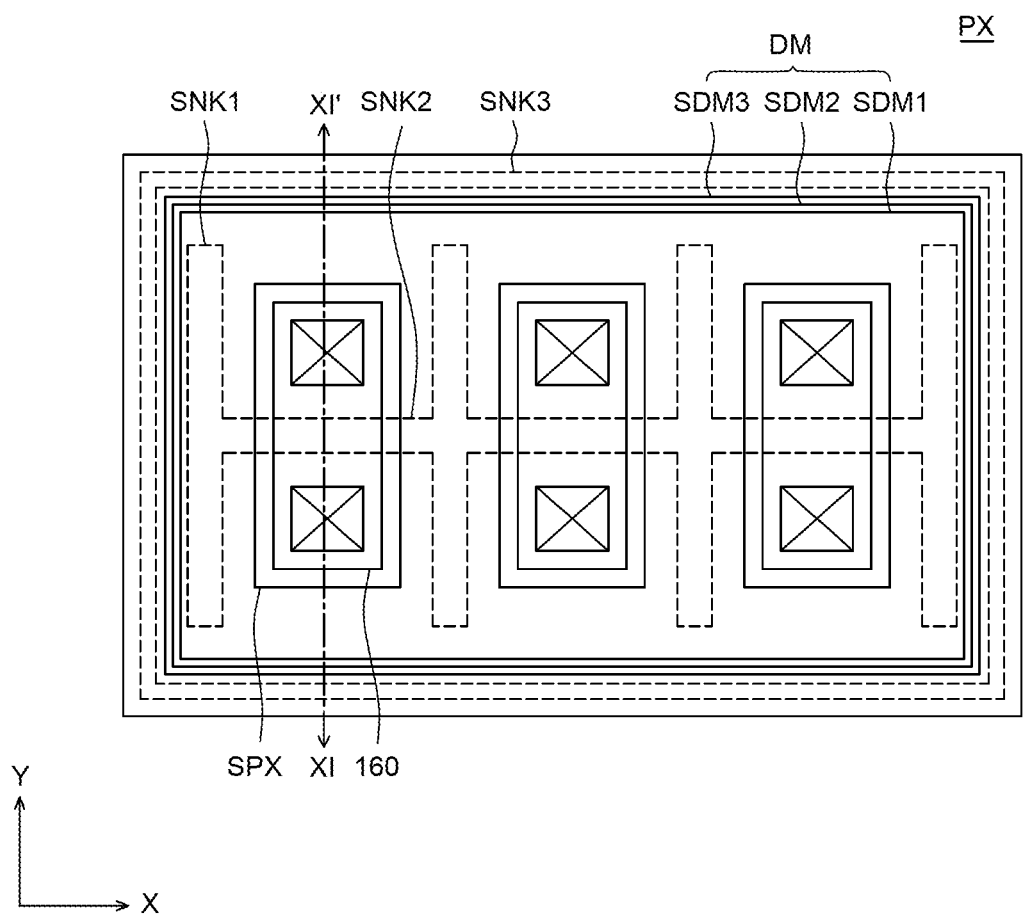
FIG. 10 is a plan view illustrating one pixel of a stretchable display device according to still another embodiment of the present disclosure.
Figure 11A:
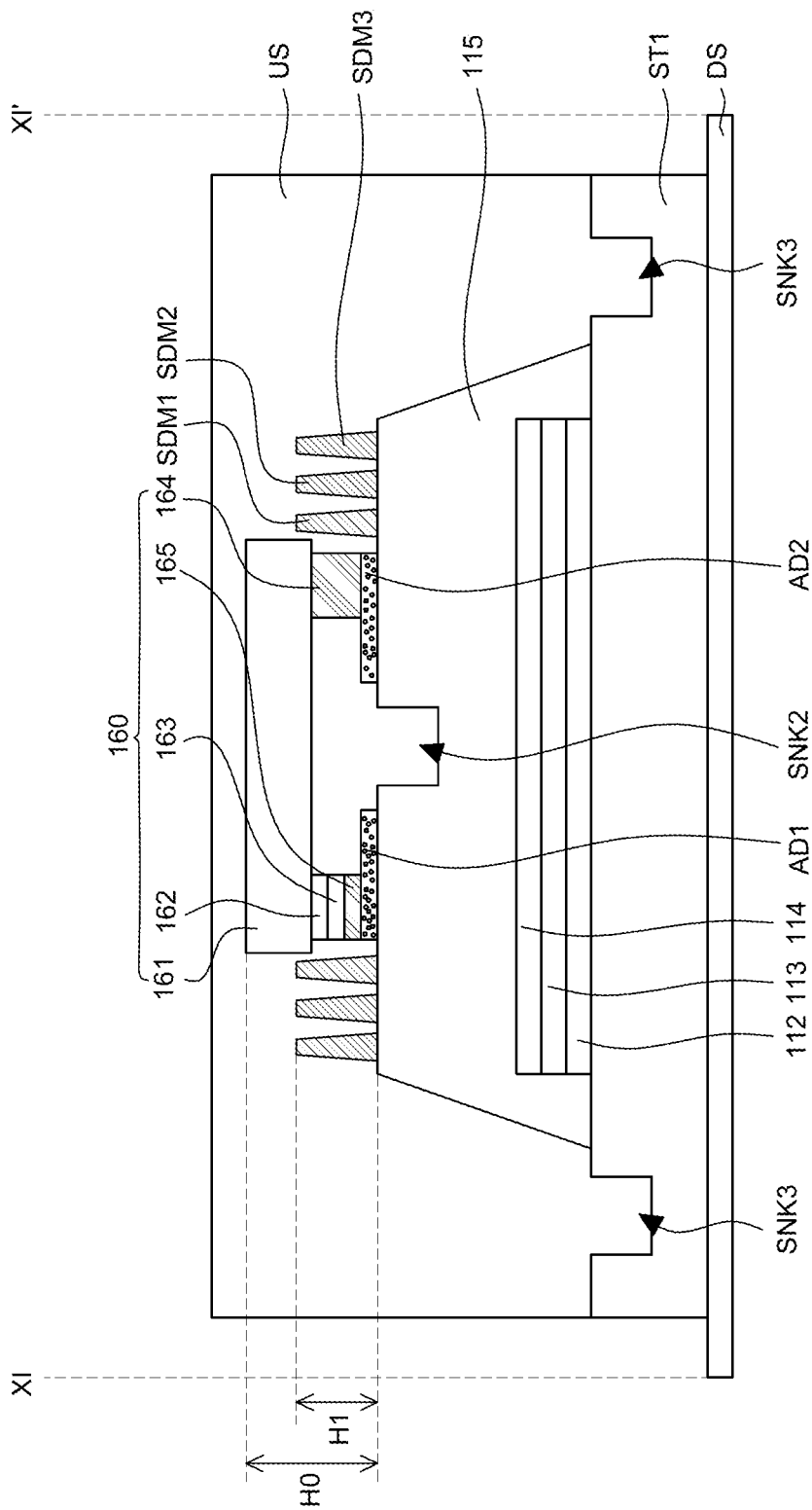
FIGS. 11A and 11B are cross-sectional views taken along the line XI-XI' of FIG. 10.
Figure 11B:
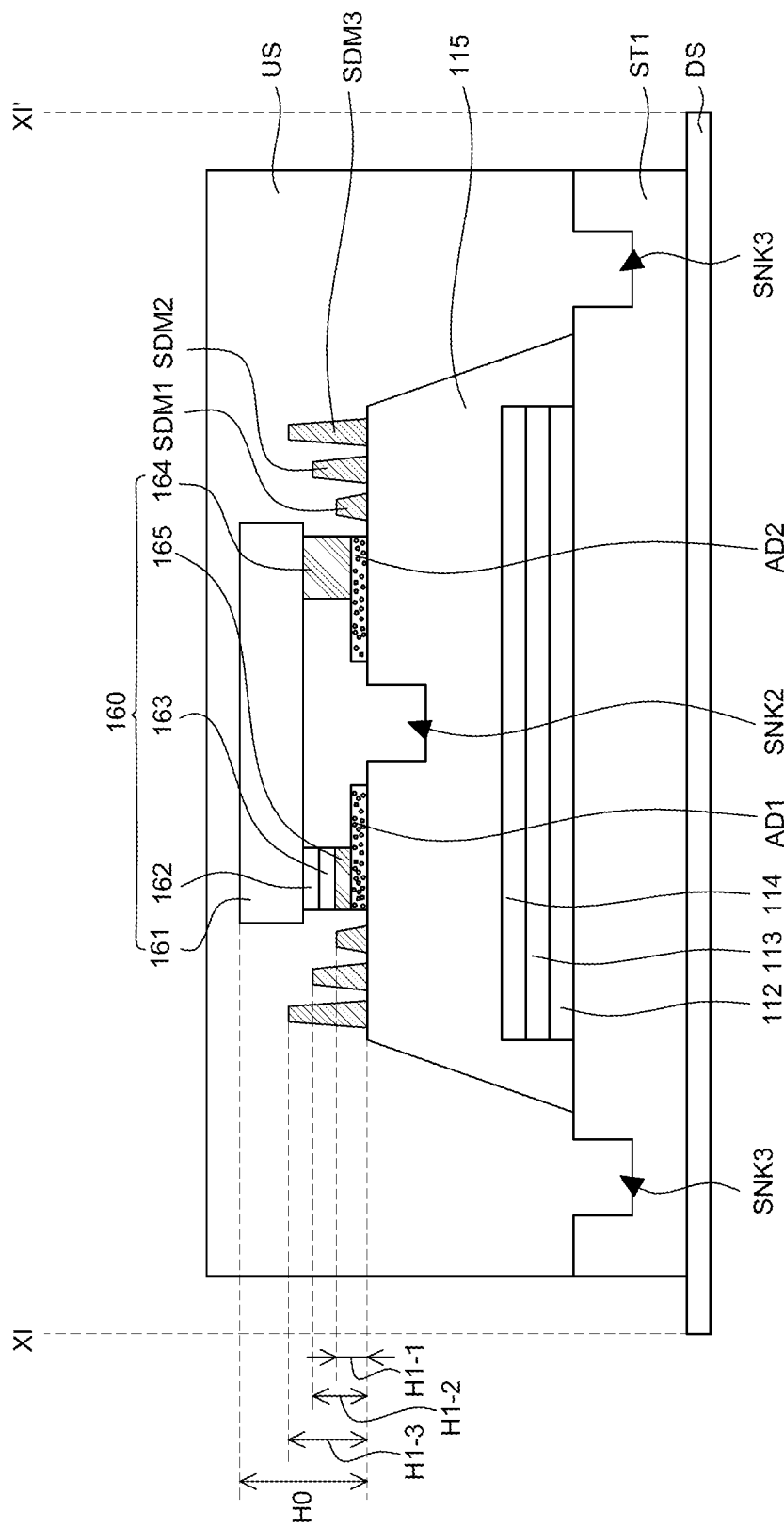

FIG. 8 is a plan view illustrating one pixel of a stretchable display device according to still another embodiment of the present disclosure. FIG. 9 is a cross-sectional view taken along the line IX-IX' of FIG. 8. FIG. 10 is a plan view illustrating one pixel of a stretchable display device according to still another embodiment of the present disclosure. FIGS. 11A and 11B are cross-sectional views taken along the line XI-XI' of FIG. 10. For the convenience of description, in FIGS. 8 to 11B, the connection line 120, the plurality of pads 131 and 132, and the plurality of connection pads 191 and 192 which are illustrated in FIG. 3 are not illustrated. Components of still another embodiment of the present disclosure are same as the components of another embodiment of the present disclosure except that at least one dam DM is added. Therefore, at least one dam DM will be described in detail.

Referring to FIGS. 8 and 9, a stretchable display device according to still another embodiment of the present disclosure may further include a dam DM which encloses an outer peripheral area of the pixel PX.

Specifically, the dam DM is formed on the planarization layer 115 so as to enclose the outer peripheral area of the pixel. Further, since the planarization layer 115 is formed in an inner area of the first substrate ST1, the dam DM formed on the planarization layer 115 may be disposed inside of the third sink pattern SNK3 disposed at the outer peripheral area of the first substrate ST1. That is, as illustrated in FIG. 8, as seen from a top view, the dam DM may be formed to enclose the plurality of sub pixels SPX and the third sink pattern SNK3 may be formed to enclose the dam DM.

Further, a height H1 of the dam DM may be lower than a height H0 of the LED 160.

As described above, the LEDs 160 are transferred onto the adhesive layer AD and the LEDs 160 are pressurized and heated to electrically connect the LEDs 160. Therefore, when the height H1 of the dam DM is higher than the height H0 of the transferred LED 160, the LED 160 may not be pressurized from an upper side due to the height H1 of the dam DM so that the LEDs 160 may not be connected. Accordingly, the height H1 of the dam DM needs to be lower than the height H0 of the LED 160.

However, in FIG. 8, it is illustrated that the dam DM is formed to be continuous as one band shape, but the present disclosure is not limited thereto and the dam DM may be divided into a plurality of dams.

As described above, the stretchable display device according to still another embodiment of the present disclosure includes the dam DM which encloses the plurality of sub pixels SPX on the planarization layer 115. Therefore, during the process of pressurizing the LED 160, the adhesive patterns AD1 and AD2 do not overflow to the first substrate ST1 due to the dam DM. Accordingly, the adhesive patterns AD1 and AD2 do not invade onto the lower substrate DS which is disposed at the outside of the first substrate ST1. By doing this, even though the stretchable display device is subjected to a heating process, the degradation of the extension rate does not occur.

Further, as illustrated in FIGS. 10, 11A, and 11B, the dam DM may be configured by a plurality of sub dams SDM1, SDM2, and SDM3.

That is, the dam DM may include a first sub dam SDM1, a second sub dam SDM2, and a third sub dam SDM3.

Specifically, as illustrated in FIG. 10, the first sub dam SDM1 is disposed inside the second sub dam SDM2 and the second sub dam SDM2 is disposed inside the third sub dam SDM3. In other words, the second sub dam SDM2 may be disposed to enclose the first sub dam SDM1 and the third sub dam SDM3 may be disposed to enclose the second sub dam SDM2.

Further, as illustrated in FIG. 11A, the heights H1 of the first sub dam SDM1, the second sub dam SDM2, and the third sub dam SDM3 may be equal. That is, the heights H1 of the first sub dam SDM1, the second sub dam SDM2, and the third sub dam SDM3 may be equal to be lower than the height H0 of the LED 160.

As described above, the stretchable display device according to still another embodiment of the present disclosure includes a plurality of sub dams SDM1, SDM2, and SDM3 which encloses the plurality of sub pixels SPX on the planarization layer 115. Therefore, the plurality of sub dams SDM1, SDM2, and SDM3 is disposed in a path through which the adhesive patterns AD1 and AD2 flow during the process of pressurizing the LED 160 to more effectively block the path through which the adhesive patterns AD1 and AD2 flow.

In some embodiments, as illustrated in FIG. 11B, a sub dam disposed at the outside among the plurality of sub dams SDM1, SDM2, and SDM3 may have a higher height H1.

That is, a height H1-2 of the second sub dam SDM2 is higher than a height H1-1 of the first sub dam SDM1 and a height H1-3 of the third sub dam SDM3 is higher than the height H1-2 of the second sub dam SDM2. Further, as described above, the height H1-3 of the third sub dam SDM3 may be still lower than the height H0 of the LED 160. In other words, the height H1-1 of the first sub dam SDM1 which is the most adjacent to the LED 160 may be the lowest.

As described above, since the height H1-1 of the first sub dam SDM1 which is the most adjacent to the LED 160 is lowest, during the process of pressurizing the LED 160, the adhesive patterns AD1 and AD2 pass over the first sub dam ADM1 to be trapped between the first sub dam SDM1 and the second sub dam SDM2. Thereafter, the adhesive patterns AD1 and AD2 pass over the second sub dam ADM2 to be trapped between the second sub dam SDM2 and the third sub dam SDM3.

If the height H1-1 of the first sub dam SDM1 is high, the adhesive patterns AD1 and AD2 do not pass over the first sub dam SDM1 so that the adhesive patterns are not trapped between the first sub dam SDM1 and the second sub dam SDM2, but accumulated along a side surface of the LED 160. Therefore, there may be a possibility that the LED 160 and the side surfaces of the adhesive patterns AD1 and AD2 are electrically connected to each other so that there is a possibility of a driving failure of the LED 160.

Accordingly, in some embodiments, the height H1-1 of the sub dam SDM1 which is disposed at the inside, among the plurality of sub dams DM, is set to be low, so that during the process of pressurizing the LED 160, the adhesive patterns AD1 and AD2 may be effectively trapped between the sub dams DM.

Still Another Embodiment of Present Disclosure—Fifth Sink Pattern

Figure 12:
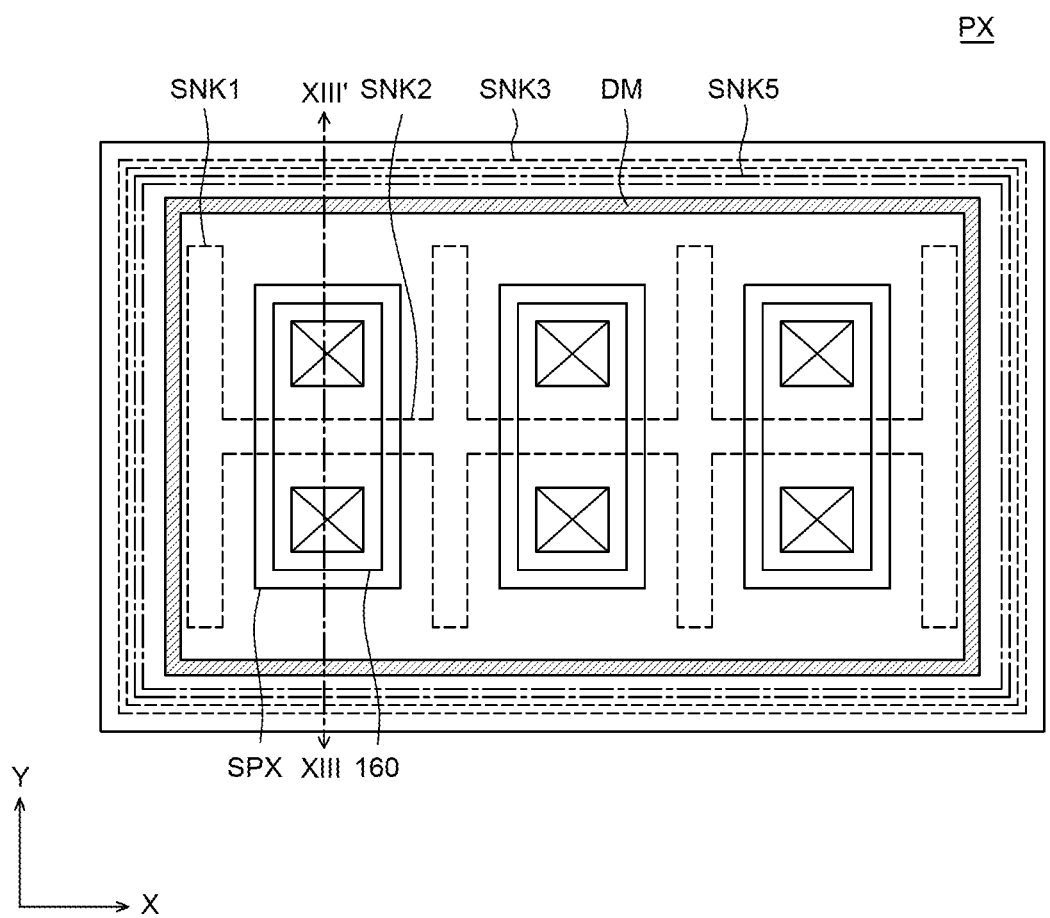
FIG. 12 is a plan view illustrating one pixel of a stretchable display device according to still another embodiment of the present disclosure.
Figure 13:
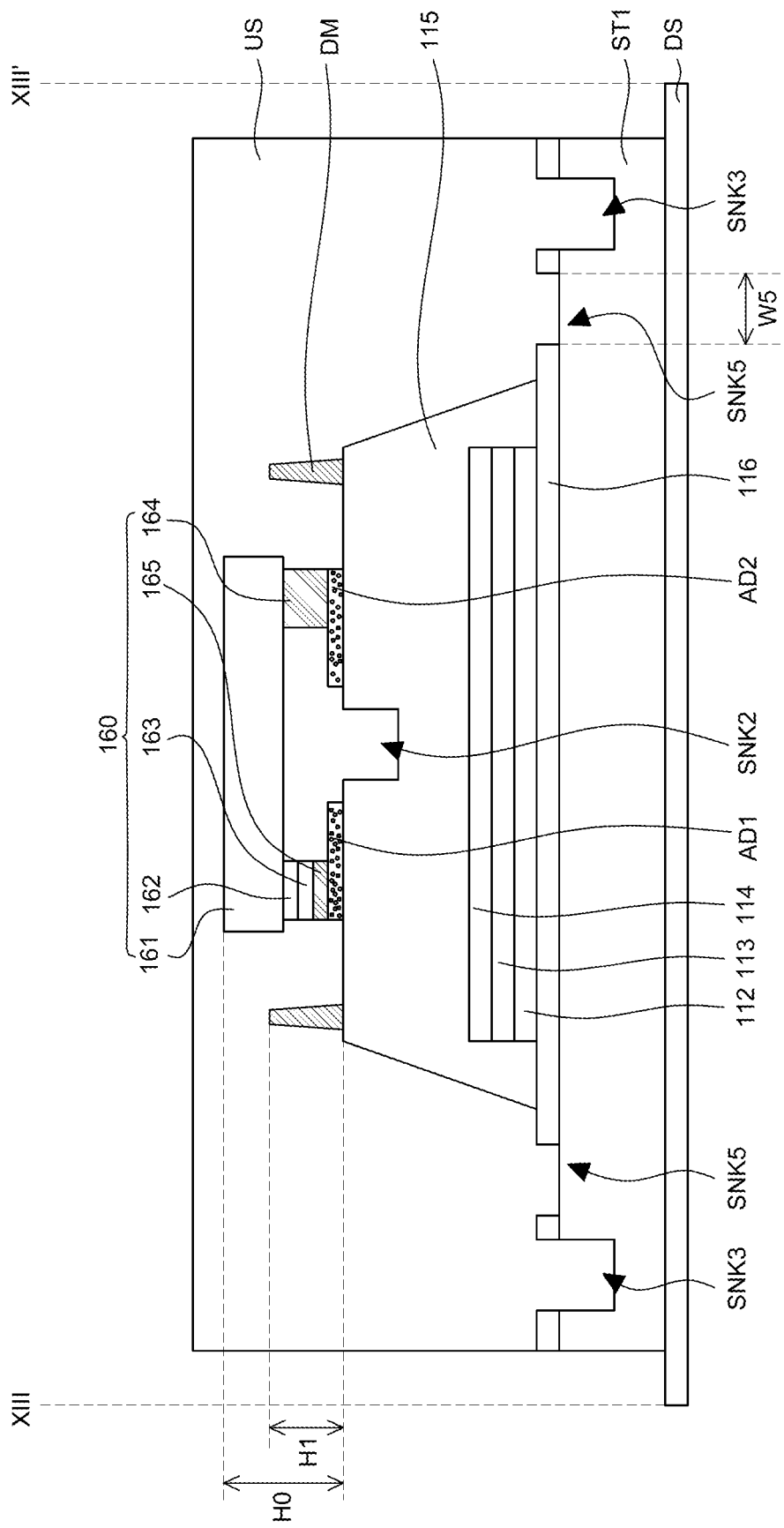
FIG. 13 is a cross-sectional view taken along the line XIII-XIII' of FIG. 12.

FIG. 12 is a plan view illustrating one pixel of a stretchable display device according to still another embodiment of the present disclosure. FIG. 13 is a cross-sectional view taken along the line XIII-XIII' of FIG. 12. Components of still another embodiment of the present disclosure are same as the components of another embodiment of the present disclosure except that an auxiliary buffer layer in which a fifth sink pattern is formed is added. Therefore, the auxiliary buffer layer in which a fifth sink pattern is formed will be described in detail.

Referring to FIGS. 12 and 13, a stretchable display device according to still another embodiment of the present disclosure may further include an auxiliary buffer layer 116 on which a fifth sink pattern SNK5 is formed.

Specifically, the auxiliary buffer layer 116 is disposed between the buffer layer 112 and the first substrate ST1.

Specifically, the auxiliary buffer layer 116 may also be disposed between the planarization layer 115 which covers a side surface of the buffer layer 112 and the first substrate ST1. That is, a lower surface of the auxiliary buffer layer 116 is in contact with the first substrate ST1 and an upper surface of the auxiliary buffer layer 116 may be in contact with the buffer layer 112 and the planarization layer 115.

The auxiliary buffer layer 116 is formed on the plurality of first substrates ST1, similarly to the buffer layer 112, to protect various components of the stretchable display device 100 from permeation of moisture $H_2O$ and oxygen $O_2$ from the outside of the lower substrate DS and the plurality of first substrates ST1. The auxiliary buffer layer 116 may be configured of an insulating material and for example, configured by a single layer or a double layer of an inorganic layer formed of silicon nitride (SiNx), silicon oxide (SiOx), and silicon oxynitride (SiON).

Further, the fifth sink pattern SNK5 may be formed in an outer peripheral area of the auxiliary buffer layer 116. That is, the fifth sink pattern SNK5 is disposed in the outer peripheral area of the auxiliary buffer layer 116 in which the buffer layer 112 and the planarization layer 115 are not disposed.

However, even though in FIG. 6, it is illustrated that the fifth sink pattern SNK5 is continuous as one band shape which encloses the first substrate ST1, the present disclosure is not limited thereto and the fifth sink pattern SNK5 may be divided into a plurality of sink patterns.

As described above, the fifth sink pattern SNK5 is formed so that the adhesive patterns AD1 and AD2 do not overflow to the area beyond the first substrate ST1 during the process of pressurizing the LED 160. That is, the fifth sink pattern SNK5 is disposed in a path where the adhesive patterns AD1 and AD2 invade the outside of the first substrate ST1. Therefore, during the process of pressurizing the LED 160, when the adhesive patterns AD1 and AD2 overflow to the outside of the first substrate ST1, the adhesive patterns AD1 and AD2 are trapped by the fifth sink pattern SNK5. Accordingly, the adhesive patterns AD1 and AD2 do not invade onto the lower substrate DS which is disposed at the outside of the first substrate ST1. By doing this, even though the stretchable display device is subjected to a heating process, the degradation of the extension rate does not occur.

Further, a width W5 of the fifth sink pattern SNK5 may be larger than the diameter of each of the conductive balls of the first adhesive pattern AD1 and the second adhesive pattern AD2. That is, the width W5 of the fifth sink pattern SNK5 may be 3 µm or larger, but it is just an example and the width W5 of the fifth sink pattern SNK5 may vary depending on the diameter of the conductive ball.

If the width W5 of the fifth sink pattern SNK5 is smaller than the diameter of each of the conductive balls of the first adhesive pattern AD1 and the second adhesive pattern AD2, the conductive balls block the upper portion of the fifth sink pattern SNK5 so that the adhesive patterns AD1 and AD2 are not trapped by the fifth sink pattern SNK5. Accordingly, the width W5 of the fifth sink pattern SNK5 needs to be formed to be larger than the diameter of each of the conductive balls of the first adhesive pattern AD1 and the second adhesive pattern AD2. By doing this, the adhesive patterns AD1 and AD2 may not overflow the area beyond the first substrate ST1 during the process of pressurizing the LED 160.

The embodiments of the present disclosure can also be described as follows:

According to an aspect of the present disclosure, a stretchable display device includes a lower substrate including a display area and a non-display area; a plurality of first substrates which is disposed on the display area and has a modulus larger than a modulus of the lower substrate; at least one transistor formed on each of the plurality of first substrates; a planarization layer which covers the at least one transistor; at least one light emitting diode which is electrically connected to the at least one transistor and is formed on the planarization layer; and a plurality of adhesive patterns which is attached to each of the at least one light emitting diode, in which the planarization layer includes at least one first sink pattern formed at a side portion of the at least one light emitting diode, thereby suppressing the degradation of the extension rate.

Conductive balls may be dispersed in the plurality of adhesive patterns and a width of each of the at least one first sink pattern may be larger than a diameter of each of the conductive balls.

The at least one light emitting diode may include a first electrode and a second electrode, the plurality of adhesive patterns includes a first adhesive pattern which is attached to the first electrode and a second adhesive pattern which is attached to the second electrode.

The planarization layer may further include at least one second sink pattern formed between the first adhesive pattern and the second adhesive pattern.

The at least one first sink pattern may be connected to the at least one second sink pattern.

Conductive balls may be dispersed in the plurality of adhesive patterns and a width of each of the at least one second sink pattern may be larger than a diameter of each of the conductive balls.

Each of the plurality of first substrates includes at least one third sink pattern formed in an area where the planarization layer is not disposed.

The at least one third sink pattern may enclose the plurality of first substrates.

A side surface of the planarization layer have a slope and at least one fourth sink pattern may be formed on the side surface of the planarization layer.

A side surface of the planarization layer may extend in one direction and the at least one fourth sink pattern extends in the one direction.

The stretchable display device may further comprise at least one dam which encloses the at least one light emitting diode, on the planarization layer.

A height of the at least one dam may be lower than a height of the at least one light emitting diode.

Each of the at least one dam may include a plurality of sub dams having the same height.

Each of the at least one dam may include a plurality of sub dams having different heights and a sub dam which is disposed at the outside, among the plurality of sub dams, has a largest height.

The stretchable display device may further comprise an auxiliary buffer layer formed between the plurality of first substrates and the planarization layer.

The auxiliary buffer layer includes at least one fifth sink pattern formed in an area where the planarization layer is not disposed.

The at least one fifth sink pattern may enclose the auxiliary buffer layer.

According to another aspect of the present disclosure, a stretchable display device includes a soft substrate which is stretchable; a plurality of rigid substrates which is disposed on the soft substrate to be spaced apart from each other; a plurality of sub pixels which is defined on the plurality of rigid substrates and includes a light emitting diode attached by an adhesive layer; a plurality of first sink pattern which is formed at a side portion of the plurality of sub pixels; at least one second sink pattern which connects the plurality of first sink patterns; and a third sink pattern which encloses the plurality of sub pixels.

The stretchable display device further comprise a planarization layer which is disposed on the plurality of rigid substrates and forms the light emitting diode on an upper surface, The plurality of first sink patterns and the at least one second sink pattern may be formed on the planarization layer.

A side surface of the planarization layer has a slope and at least one fourth sink pattern is formed on the side surface of the planarization layer.

The third sink pattern may be formed in an area of the plurality of rigid substrates on which the planarization layer is not disposed.

The stretchable display device may further comprise at least one dam which encloses the plurality of sub pixels.

A height of the at least one dam may be lower than a height of the light emitting diode.

Each of the at least one dam may include a plurality of sub dams having different heights, and a height of a sub dam which is adjacent to the plurality of sub pixels, among the plurality of sub dams, is low.

The stretchable display device may further comprise an auxiliary buffer layer formed between the plurality of rigid substrates and the planarization layer A fifth sink pattern may be disposed at an outer peripheral area of the auxiliary buffer layer.

Although the embodiments of the present disclosure have been described in detail with reference to the accompanying drawings, the present disclosure is not limited thereto and may be embodied in many different forms without departing from the technical concept of the present disclosure. Therefore, the embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A stretchable display device, comprising:
a base substrate having a display area and a non-display area;
a plurality of first substrates which is disposed on the display area and has a modulus larger than a modulus of the base substrate;
at least one transistor formed on each of the plurality of first substrates;
a planarization layer on the at least one transistor;
at least one light emitting diode which is connected to the at least one transistor and is formed on the planarization layer;
a plurality of adhesive patterns which is connected to each of the at least one light emitting diode; and at least one first sink pattern included in the planarization layer, the at least one first sink pattern adjacent to a side portion of the at least one light emitting diode.

2. The stretchable display device according to claim 1, wherein the plurality of adhesive patterns includes conductive balls, and a width of each of the at least one first sink pattern is larger than a diameter of each of the conductive balls.

3. The stretchable display device according to claim 1, wherein the at least one light emitting diode includes a first electrode and a second electrode, the plurality of adhesive patterns includes a first adhesive pattern which is attached to the first electrode and a second adhesive pattern which is attached to the second electrode, and the planarization layer further includes at least one second sink pattern formed between the first adhesive pattern and the second adhesive pattern.

4. The stretchable display device according to claim 3, wherein the at least one first sink pattern is connected to the at least one second sink pattern.

5. The stretchable display device according to claim 3, wherein the plurality of adhesive patterns includes conductive balls, and a width of each of the at least one second sink pattern is larger than a diameter of each of the conductive balls.

6. The stretchable display device according to claim 1, wherein each of the plurality of first substrates includes at least one third sink pattern formed in an area where the planarization layer is not disposed.

7. The stretchable display device according to claim 6, wherein the at least one third sink pattern encloses the plurality of first substrates.

8. The stretchable display device according to claim 1, wherein a side surface of the planarization layer has a slope and at least one fourth sink pattern is formed on the side surface of the planarization layer.

9. The stretchable display device according to claim 1, wherein a side surface of the planarization layer extends in one direction and the at least one fourth sink pattern extends in the one direction.

10. The stretchable display device according to claim 1, further comprising at least one dam on the planarization layer, the at least one dam adjacent to the at least one light emitting diode.

11. The stretchable display device according to claim 10, wherein a height of the at least one dam is lower than a height of the at least one light emitting diode.

12. The stretchable display device according to claim 10, wherein each of the at least one dam includes a plurality of sub dams having the same or substantially the same height.

13. The stretchable display device according to claim 10, wherein each of the at least one dam includes a plurality of sub dams having different heights and a sub dam which is disposed at the outside has a largest height among the plurality of sub dams.

14. The stretchable display device according to claim 1, further comprising:

an auxiliary buffer layer formed between the plurality of first substrates and the planarization layer,
wherein the auxiliary buffer layer includes at least one fifth sink pattern formed in an area where the planarization layer is not disposed.

15. The stretchable display device according to claim 14, wherein the at least one fifth sink pattern encloses the auxiliary buffer layer.

16. A stretchable display device, comprising:
a first substrate which is stretchable;
a plurality of second substrates on the first substrate, the plurality of second substrates being spaced apart from each other, the second substrate being more rigid than the first substrate;
a plurality of sub pixels which is defined on the plurality of second substrates and includes a light emitting diode;
a plurality of first sink patterns which is formed at a side portion of the plurality of sub pixels;
at least one second sink pattern which connects the plurality of first sink patterns; and
a third sink pattern which encloses the plurality of sub pixels.

17. The stretchable display device according to claim 16, further comprising:
a planarization layer disposed on the plurality of second substrates and the light emitting diode formed on an upper surface of the planarization layer,
wherein the plurality of first sink patterns and the at least one second sink pattern are formed in the planarization layer.

18. The stretchable display device according to claim 17, wherein a side surface of the planarization layer has a slope and at least one fourth sink pattern is formed on the side surface of the planarization layer.

19. The stretchable display device according to claim 17, wherein the third sink pattern is formed in an area of the plurality of second substrates on which the planarization layer is not disposed.

20. The stretchable display device according to claim 17, further comprising:
an auxiliary buffer layer formed between the plurality of second substrates and the planarization layer,
wherein a fifth sink pattern is adjacently disposed at an outer peripheral area of the auxiliary buffer layer.

21. The stretchable display device according to claim 16, further comprising:
at least one dam which encloses the plurality of sub pixels.

22. The stretchable display device according to claim 21, wherein a height of the at least one dam is lower than a height of the light emitting diode.

23. The stretchable display device according to claim 21, wherein each of the at least one dam includes a plurality of sub dams having different heights, and a height of a sub dam closest to the plurality of sub pixels is the lowest among the plurality of sub dams.

* * * * *